(12) United States Patent
Tsai et al.

(10) Patent No.: US 11,322,447 B2
(45) Date of Patent: May 3, 2022

(54) DUAL-SIDED ROUTING IN 3D SIP STRUCTURE

(71) Applicant: Taiwan Semiconductor Manufacturing Company, Ltd., Hsinchu (TW)

(72) Inventors: Po-Hao Tsai, Zhongli (TW); Po-Yao Chuang, Hsinchu (TW); Meng-Liang Lin, Hsinchu (TW); Yi-Wen Wu, Xizhi (TW); Shin-Puu Jeng, Po-Shan Village (TW); Techi Wong, Xizhi (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/811,465

(22) Filed: Mar. 6, 2020

(65) Prior Publication Data
US 2021/0050295 A1 Feb. 18, 2021

Related U.S. Application Data

(60) Provisional application No. 62/888,277, filed on Aug. 16, 2019.

(51) Int. Cl.
*H01L 23/538* (2006.01)
*H01L 21/48* (2006.01)
*H01L 21/56* (2006.01)
*H01L 23/00* (2006.01)
*H01L 21/768* (2006.01)

(52) U.S. Cl.
CPC ...... *H01L 23/5384* (2013.01); *H01L 21/4885* (2013.01); *H01L 21/56* (2013.01); *H01L 21/76802* (2013.01); *H01L 23/5385* (2013.01); *H01L 23/5386* (2013.01); *H01L 24/14* (2013.01)

(58) Field of Classification Search
CPC ............ H01L 23/5384; H01L 23/5386; H01L 23/5385; H01L 21/4885; H01L 21/56; H01L 21/76802; H01L 24/14
See application file for complete search history.

(56) References Cited

U.S. PATENT DOCUMENTS

| | | |
|---|---|---|
| 2015/0279820 A1 | 10/2015 | Usami et al. |
| 2016/0057863 A1 | 2/2016 | Kyozuka |
| 2016/0260684 A1 | 9/2016 | Zhai et al. |
| 2017/0098629 A1* | 4/2017 | Liu ...................... H01L 23/5389 |
| 2018/0190581 A1* | 7/2018 | Lin .................. H01L 21/76895 |
| 2018/0269189 A1 | 9/2018 | Jeng et al. |
| 2019/0013273 A1 | 1/2019 | Jeng et al. |

FOREIGN PATENT DOCUMENTS

| | | |
|---|---|---|
| JP | 2015195263 A | 11/2015 |
| KR | 20160024802 A | 3/2016 |

\* cited by examiner

*Primary Examiner* — Quoc D Hoang
(74) *Attorney, Agent, or Firm* — Slater Matsil, LLP

(57) ABSTRACT

A semiconductor package is fabricated by attaching a first component to a second component. The first component is assembled by forming a first redistribution structure over a substrate. A through via is then formed over the first redistribution structure, and a die is attached to the first redistribution structure active-side down. The second component includes a second redistribution structure, which is then attached to the through via. A molding compound is deposited between the first redistribution structure and the second redistribution structure and further around the sides of the second component.

20 Claims, 39 Drawing Sheets

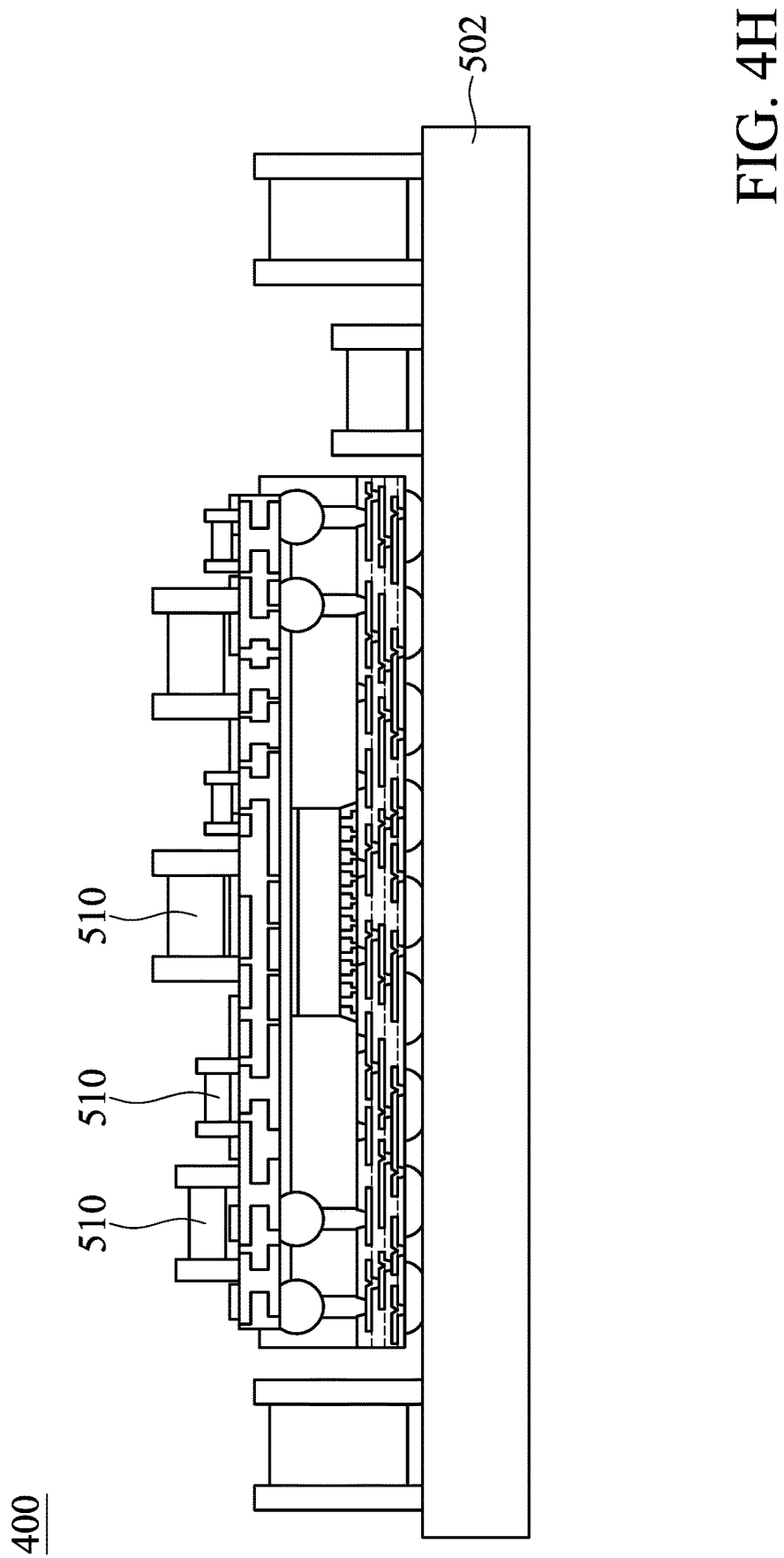

DUAL-SIDED ROUTING IN 3D SIP STRUCTURE

PRIORITY CLAIM AND CROSS-REFERENCE

This application claims the benefit of U.S. Provisional Application No. 62/888,277, filed on Aug. 16, 2019, which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A through 4H illustrate cross-sectional views of intermediate steps during a process for forming package components, in accordance with some embodiments.

DETAILED DESCRIPTION

Figure 1:
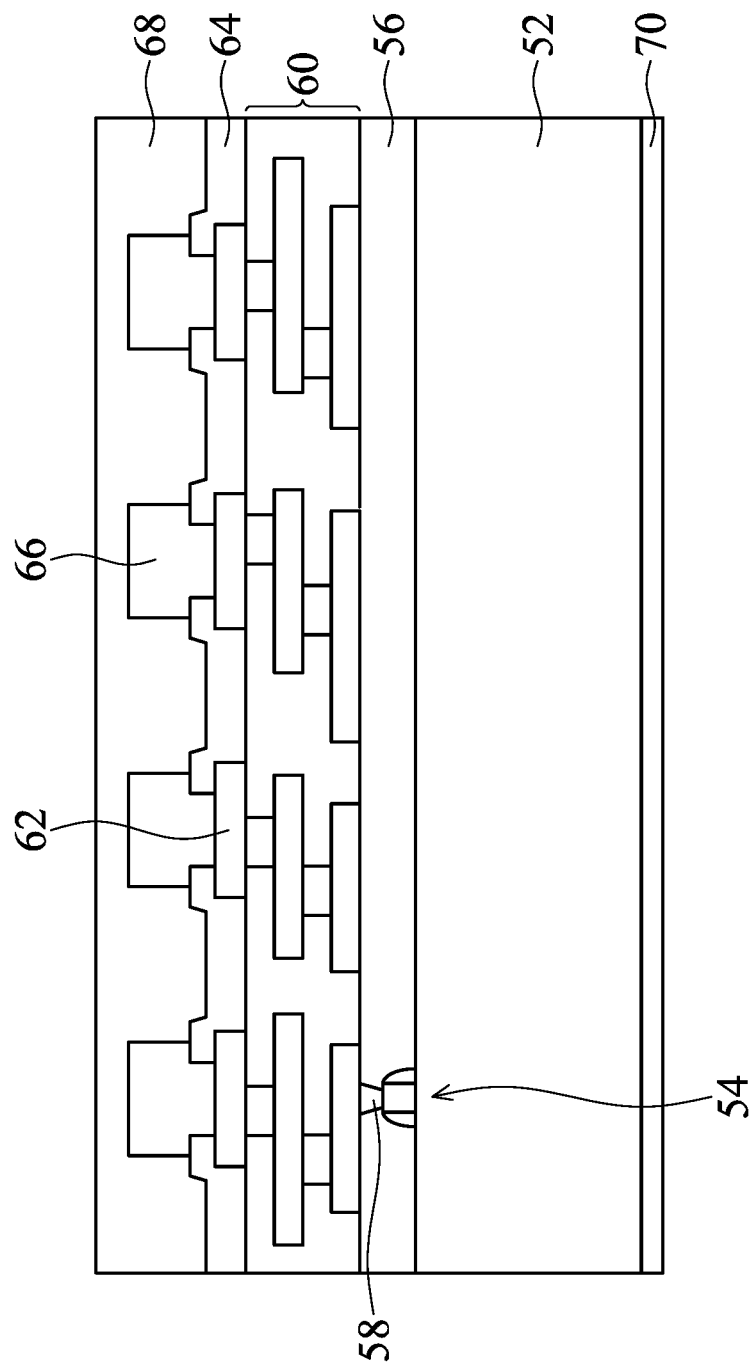
FIG. 1 illustrates a cross-sectional view of an integrated circuit die, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, one or more integrated circuit dies and other devices are attached to dual-sided redistribution structures and embedded in an encapsulant to form a semiconductor system-in-package (SiP) structure. One of the redistribution structures may have a fan-out design while the other may be formed in a carrier-type substrate. The placement of the integrated circuit dies and layouts of the redistribution structures provide versatility in the overall package. Further, the design of the package and redistribution structures, as well as the methodology, facilitate a thinner SiP structure with greater strength and reduced overall package warpage.

FIG. 1 illustrates a cross-sectional view of an integrated circuit die 50, in accordance with some embodiments. The integrated circuit die 50 will be packaged in subsequent processing to form an integrated circuit package. The integrated circuit die 50 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof.

The integrated circuit die 50 may be formed in a wafer, which may include different device regions that are singulated in subsequent steps to form a plurality of integrated circuit dies. The integrated circuit die 50 may be processed according to applicable manufacturing processes to form integrated circuits. For example, the integrated circuit die 50 includes a semiconductor substrate 52, such as silicon, doped or undoped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52 has an active surface (e.g., the surface facing upwards in FIG. 1), sometimes called a front side, and an inactive surface (e.g., the surface facing downwards in FIG. 1), sometimes called a back side.

Devices (one being shown in FIG. 1) 54 may be formed at the front surface of the semiconductor substrate 52. The devices 54 may be active devices (e.g., transistors, diodes, etc.), capacitors, resistors, etc. An inter-layer dielectric (ILD) 56 is over the front surface of the semiconductor substrate 52. The ILD 56 surrounds and may cover the devices 54. The ILD 56 may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like.

Conductive plugs 58 extend through the ILD 56 to electrically and physically couple the devices 54. For example, when the devices 54 are transistors, the conductive plugs 58 may couple the gates and source/drain regions of the transistors. The conductive plugs 58 may be formed of tungsten, cobalt, nickel, copper, silver, gold, aluminum, the like, or combinations thereof. An interconnect structure 60 is over the ILD 56 and conductive plugs 58. The interconnect structure 60 interconnects the devices 54 to form an integrated circuit. The interconnect structure 60 may be formed by, for example, metallization patterns in dielectric layers on the ILD 56. The metallization patterns include metal lines and vias formed in one or more low-k dielectric layers. The metallization patterns of the interconnect structure 60 are electrically coupled to the devices 54 by the conductive plugs 58.

The integrated circuit die 50 further includes pads 62, such as aluminum pads, to which external connections are made. The pads 62 are on the active side of the integrated circuit die 50, such as in and/or on the interconnect structure 60. One or more passivation films 64 are on the integrated circuit die 50, such as on portions of the interconnect structure 60 and pads 62. Openings extend through the passivation films 64 to the pads 62. Die connectors 66, such as conductive pillars (for example, formed of a metal such as copper), extend through the openings in the passivation films 64 and are physically and electrically coupled to respective ones of the pads 62. In some embodiments, die connectors 66 comprise under-bump metallization (UBM) structures. Although only four die connectors 66 are illustrated in FIG. 1, there may be many more, as will be illustrated in later illustrations of the integrated circuit dies 50. The die connectors 66 (e.g., copper pillars) may be formed by, for example, plating, or the like. The die connectors 66 electrically couple the respective integrated circuits of the integrated circuit die 50.

Optionally, solder regions (e.g., solder balls or solder bumps, not shown) may be disposed on the pads 62 and/or the die connectors 66. The solder regions may be used to perform chip probe (CP) testing on the integrated circuit die 50. CP testing may be performed on the integrated circuit die 50 to ascertain whether the integrated circuit die 50 is a known good die (KGD). Thus, only integrated circuit dies 50, which are KGDs, undergo subsequent processing are packaged, and integrated circuit dies 50 which fail the CP testing are not packaged. After testing, the solder regions may be removed in subsequent processing steps.

A dielectric layer 68 may (or may not) be on the active side of the integrated circuit die 50, such as on the passivation films 64 and the die connectors 66. The dielectric layer 68 laterally encapsulates the die connectors 66, and the dielectric layer 68 is laterally coterminous with the integrated circuit die 50 after singulation. Initially, the dielectric layer 68 may bury the die connectors 66, such that the topmost surface of the dielectric layer 68 is above the topmost surfaces of the die connectors 66. In some embodiments where solder regions are disposed on the die connectors 66, the dielectric layer 68 may also bury the solder regions. Alternatively, the solder regions may be removed prior to forming the dielectric layer 68.

The dielectric layer 68 may be a polymer such as PBO, polyimide, BCB, or the like; a nitride such as silicon nitride or the like; an oxide such as silicon oxide, PSG, BSG, BPSG, or the like; the like, or a combination thereof. The dielectric layer 68 may be formed, for example, by spin coating, lamination, chemical vapor deposition (CVD), or the like. In some embodiments, the die connectors 66 are exposed through the dielectric layer 68 during formation of the integrated circuit die 50. In some embodiments, the die connectors 66 remain buried and are exposed during a subsequent process for packaging the integrated circuit die 50. Exposing the die connectors 66 may remove any solder regions that may be present on the die connectors 66.

At some point in the process, an adhesive layer 70 may be applied to a back side of the integrated circuit die 50. In some embodiments, the adhesive layer is formed over the back side of the integrated circuit die 50 prior to attaching the integrated circuit die to a semiconductor package component as discussed in greater detail below.

In some embodiments, the integrated circuit die 50 is a stacked device that includes multiple semiconductor substrates 52. For example, the integrated circuit die 50 may be a memory device such as a hybrid memory cube (HMC) module, a high bandwidth memory (HBM) module, or the like that includes multiple memory dies. In such embodiments, the integrated circuit die 50 includes multiple semiconductor substrates 52 interconnected by through-substrate vias (TSVs). Each of the semiconductor substrates 52 may (or may not) have an interconnect structure 60.

The following describes the formation of a semiconductor package incorporating the integrated circuit die 50 in accordance with some embodiments. FIGS. 2A through 2G describe various intermediate steps in the formation of a first component, in accordance with some embodiments. As will be discussed, the first component may comprise a fan-out redistribution structure with an integrated circuit die 50 attached. FIGS. 3A through 3H describe the formation of a second component, which may be attached to the first component described with reference to FIGS. 2A through 2G, in accordance with some embodiments. As will be discussed, the second component may comprise a substrate-type redistribution structure. Although not specifically described, the second component may comprise a fan-out redistribution structure similar to that of the first component. FIGS. 4A through 4H describe attaching the second component to the first component and further processing to form a semiconductor package, in accordance with some embodiments.

Figure 2A:
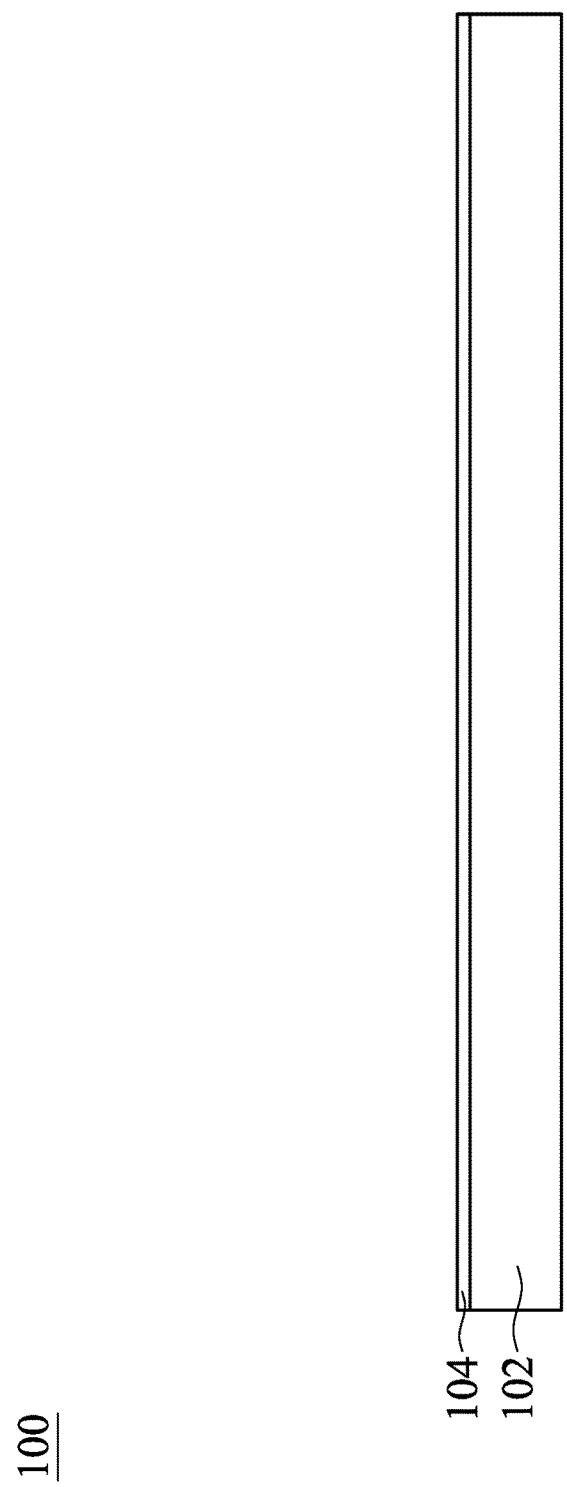
FIGS. 2A through 2G illustrate cross-sectional views of intermediate steps during a process for forming package components, in accordance with some embodiments.

Referring first to FIG. 2A, in the formation of a first component 100, a first carrier substrate 102 is provided, and a release layer 104 is formed on the first carrier substrate 102. The first carrier substrate 102 may be a glass carrier substrate, a ceramic carrier substrate, or the like. The first carrier substrate 102 may be a wafer, such that multiple packages can be formed on the first carrier substrate 102 simultaneously, wherein each package may contain one or more dies. The release layer 104 may be formed of a polymer-based material, which may be removed along with the first carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In some embodiments, the release layer 104 may be an ultra-violet (UV) glue, which loses its adhesive property when exposed to UV lights. The release layer 104 may be dispensed as a liquid and cured, may be a laminate film laminated onto the first carrier substrate 102, or may be the like.

In FIGS. 2B-2E, a first-side redistribution structure 106 may be formed on the release layer 104. In the embodiment shown, the first-side redistribution structure 106 includes one or more dielectric layers and metallization patterns (sometimes referred to as redistribution layers or redistribution lines). The first-side redistribution structure 106 will be described as having three layers of metallization patterns. More or fewer dielectric layers and metallization patterns may be formed in the first-side redistribution structure 106. If fewer dielectric layers and metallization patterns are to be formed, steps and process discussed below may be omitted. If more dielectric layers and metallization patterns are to be formed, steps and processes discussed below may be repeated.

Figure 2B:
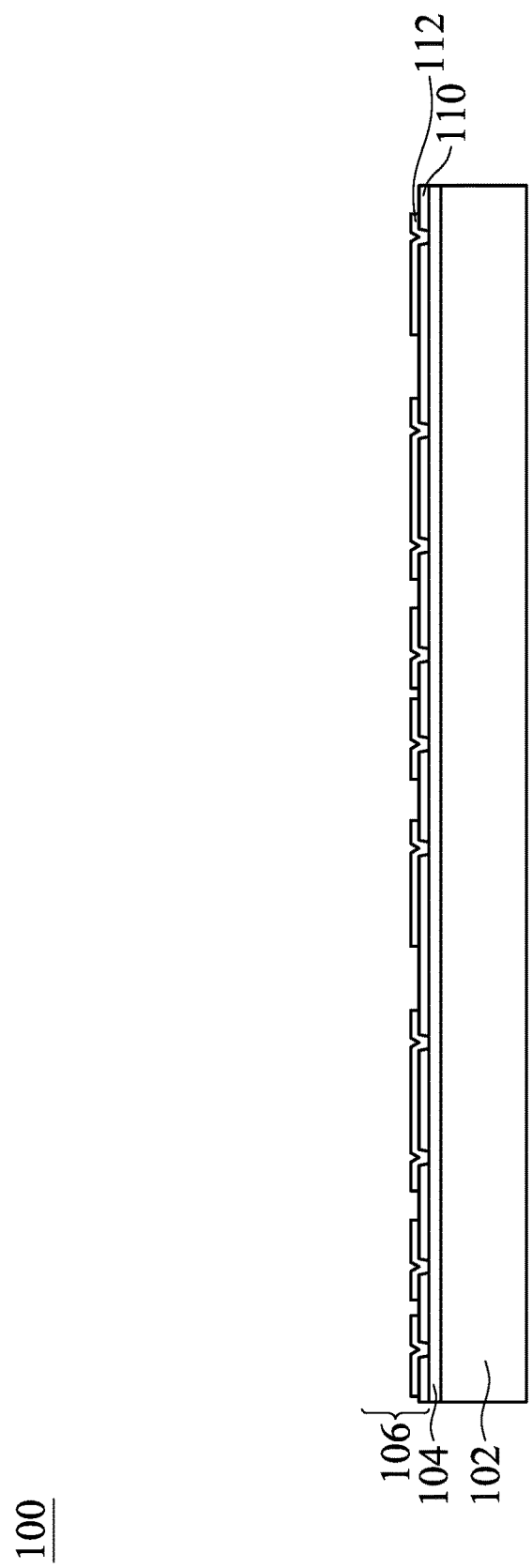

Referring now to FIG. 2B, a dielectric layer 110 is formed on the release layer 104. The bottom surface of the dielectric layer 110 may be in contact with the top surface of the release layer 104. In some embodiments, the dielectric layer 110 is formed of a photo-sensitive material such as polybenzoxazole (PBO), polyimide, benzocyclobutene (BCB), or the like, which may be patterned using a lithography mask. In some embodiments, the dielectric layer 110 is formed of a nitride such as silicon nitride; an oxide such as silicon oxide, phosphosilicate glass (PSG), borosilicate glass (BSG), boron-doped phosphosilicate glass (BPSG), or the like. The dielectric layer 110 may be formed by spin coating, lamination, CVD, the like, or a combination thereof. The dielectric layer 110 is patterned to form openings exposing portions of the release layer 104. The patterning may be by an acceptable process, such as by exposing the dielectric layer 110 to light, developing, and curing when the dielectric layer 110 is a photo-sensitive material or by etching using, for example, an anisotropic etch.

A metallization pattern 112 is then formed on the dielectric layer 110. The metallization pattern 112 includes line portions (also referred to as conductive lines) on and extending along the major surface of the dielectric layer 110. The metallization pattern 112 further includes via portions (also referred to as conductive vias) extending through the dielectric layer 110 to physically and electrically couple the first-side redistribution structure 106 with external connectors that may be formed in later steps. As an example to form the metallization pattern 112, a seed layer is formed over the dielectric layer 110 and in the openings extending through the dielectric layer 110. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist is then formed and patterned on the seed layer. The photoresist may be formed by spin coating or the like and may be exposed to light for patterning. The pattern of the photoresist corresponds to the metallization pattern 112. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the conductive material and underlying portions of the seed layer form the metallization pattern 112.

Figure 2C:
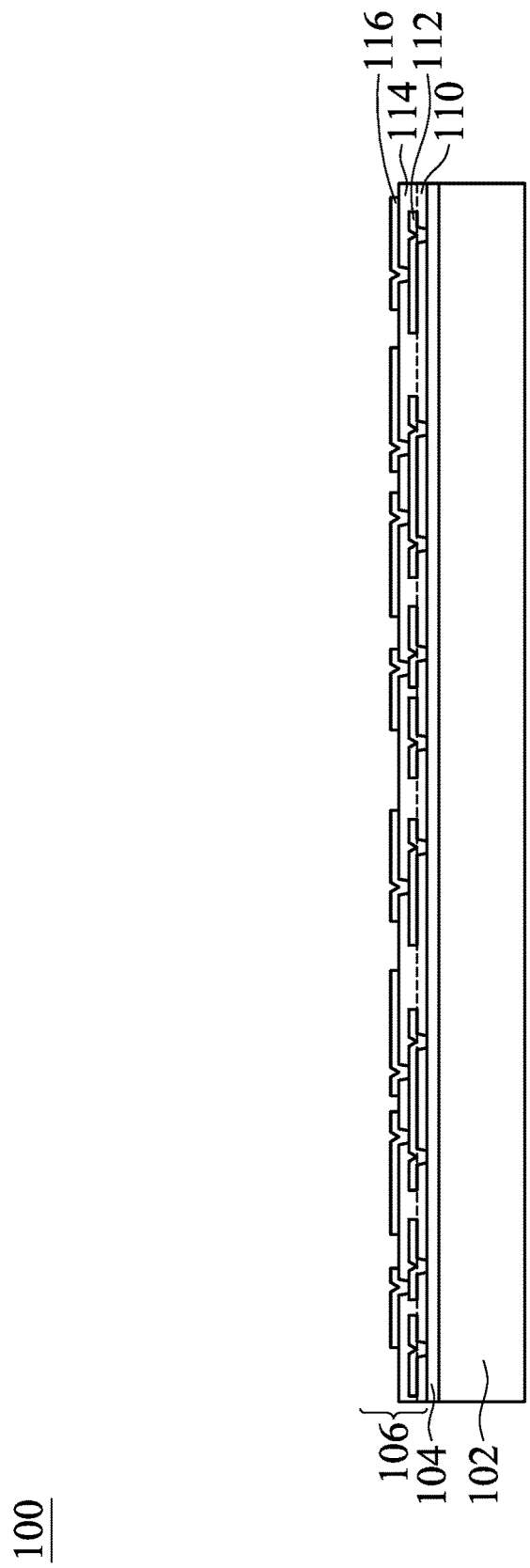

In FIG. 2C, a dielectric layer 114 is deposited on the metallization pattern 112 and dielectric layer 110. The dielectric layer 114 may be formed and patterned in a manner similar to the dielectric layer 110.

A metallization pattern 116 is then formed. The metallization pattern 116 includes line portions on and extending along the major surface of the dielectric layer 114. The metallization pattern 116 further includes via portions extending through the dielectric layer 114 to physically and electrically couple the metallization pattern 112. The metallization pattern 116 may be formed in a similar manner and of a similar material as the metallization pattern 112. In some embodiments, the metallization pattern 116 has a different size than the metallization pattern 112. For example, the conductive lines and/or vias of the metallization pattern 112 may be wider or thicker than the conductive lines and/or vias of the metallization pattern 116. Further, the metallization pattern 112 may be formed to a greater pitch than the metallization pattern 116.

Figure 2D:
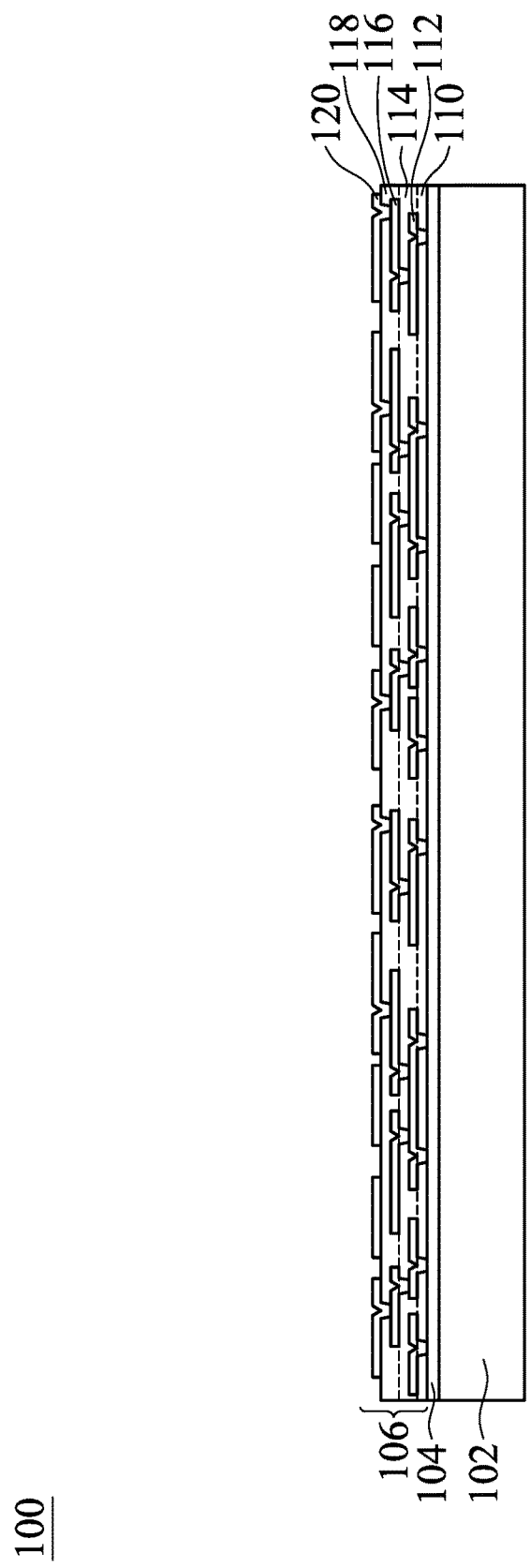

In FIG. 2D, a dielectric layer 118 is deposited on the metallization pattern 116 and dielectric layer 114. The dielectric layer 118 may be formed and patterned in a manner similar to the dielectric layers 110 and/or 114.

A metallization pattern 120 is then formed. The metallization pattern 120 includes line portions on and extending along the major surface of the dielectric layer 118. The metallization pattern 120 further includes via portions extending through the dielectric layer 118 to physically and electrically couple the metallization pattern 116. The metallization pattern 120 may be formed in a similar manner and of a similar material as the metallization patterns 112 and/or 116.

Figure 2E:
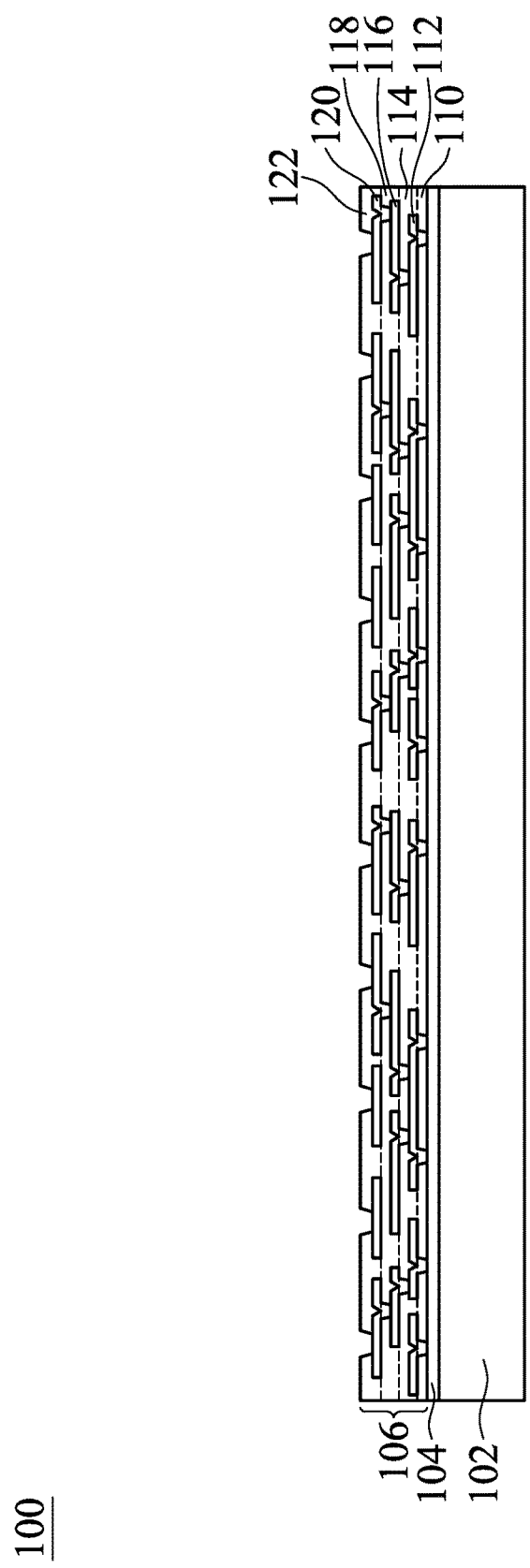

In FIG. 2E, a dielectric layer 122 is deposited on the metallization pattern 120 and dielectric layer 118. The dielectric layer 122 may be formed and patterned in a manner similar to the dielectric layer 110 to form openings 124.

The dielectric layer 110 and metallization pattern 112 are the bottommost dielectric layer and metallization pattern, respectively, of the first-side redistribution structure 106. As such, all of the intermediate dielectric layers and metallization patterns of the first-side redistribution structure 106 (e.g., dielectric layers 114, 118, and 122, and the metallization patterns 116 and 120) are disposed between the dielectric layer 110/metallization pattern 112 and the components that will be subsequently formed or attached above the first-side redistribution structure 106. In some embodiments, the metallization pattern 112 has a different size than the metallization patterns 116 and 120. For example, the conductive lines of the metallization pattern 112 may have a thickness of about 0.5 µm to about 15 µm, or about 5 µm, and the conductive lines of the metallization patterns 116 and 120 may have a thickness of about 0.5 µm to about 15 µm, or about 5 µm. The ratio of the thickness of the metallization pattern 112 to the thickness of the metallization pattern 120 may be about 0.3 to about 3, or about 1. Further, the metallization pattern 112 may be formed to a greater pitch than the metallization patterns 116 and 120. For example, the conductive lines of the metallization pattern 112 may have a pitch of about 1 µm to about 100 µm, or about 10 µm, and the conductive lines of the metallization patterns 116 and 120 may have a pitch of about 1 µm to about 100 µm, or about 10 µm. The ratio of the pitch of the metallization pattern 112 to the pitch of the metallization pattern 120 may be about 0.1 to about 10, or about 1. It should be appreciated that the first-side redistribution structure 106 may include any number of dielectric layers and metallization patterns. If more dielectric layers and metallization patterns are to be formed, steps and processes discussed above may be repeated.

Figure 2F:
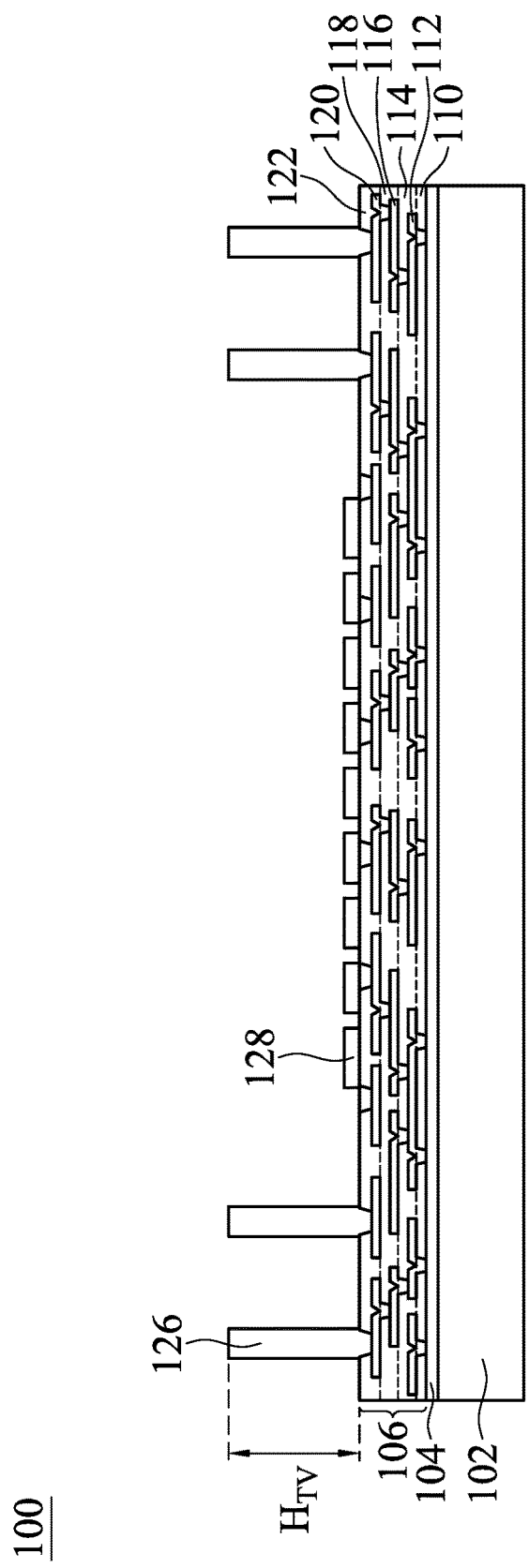

In FIG. 2F, through vias 126 are formed in some of the openings 124 and extending away from the topmost dielectric layer of the first-side redistribution structure 106 (e.g., the dielectric layer 122). As an example to form the through vias 126, a seed layer (not shown) is formed over the first-side redistribution structure 106, e.g., on the dielectric layer 122 and portions of the metallization pattern 120 exposed by the openings. In some embodiments, the seed layer is a metal layer, which may be a single layer or a composite layer comprising a plurality of sub-layers formed of different materials. In some embodiments, the seed layer comprises a titanium layer and a copper layer over the titanium layer. In some embodiments, that seed layer is made of copper, titanium, nickel, gold, palladium, the like, or a combination thereof. The seed layer may be formed using, for example, PVD or the like. A mask, such as a photoresist (not shown), is formed and patterned on the seed layer. The photoresist may be formed by spin coating or the like and may be exposed to light for patterning. The pattern of the photoresist corresponds to the through vias 126 and exposes the seed layer. A conductive material is formed in the openings of the photoresist and on the exposed portions of the seed layer. The conductive material may be formed by plating, such as electro-chemical plating process or electro-less plating, CVD, atomic layer deposition (ALD), PVD, the like, or a combination thereof. The conductive material may comprise a metal, like copper, titanium, tungsten, aluminum, or the like. The photoresist may be removed.

Still referring to FIG. 2F, bond pads 128 are formed in some of the openings 124 and extending away from the dielectric layer 122. The bond pads 128 may be formed in a manner similar to the through vias 126, and may be formed of the same material as the through vias 126. In addition, the bond pads 128 may be formed before, after, or simultaneously with the through vias 126.

The photoresist used for the bond pads 128 and for the through vias 126 and portions of the seed layer on which the bond pads 128 and the through vias 126 are not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the bond pads 128 and the through vias 126.

As discussed below, an integrated circuit die (such as integrated circuit die 50 discussed above with reference to FIG. 1) may be attached to the bond pads 128. In some embodiments, the bond pads 128 are UBMs that may include, for example, three layers of conductive materials, such as a layer of titanium, a layer of copper, and a layer of nickel. Other arrangements of materials and layers, such as an arrangement of chrome/chrome-copper alloy/copper/gold, an arrangement of titanium/titanium tungsten/copper, or an arrangement of copper/nickel/gold, may be utilized for the formation of the bond pads 128. Any suitable materials or layers of material that may be used for the bond pads 128 are fully intended to be included within the scope of the current application.

Figure 2G:
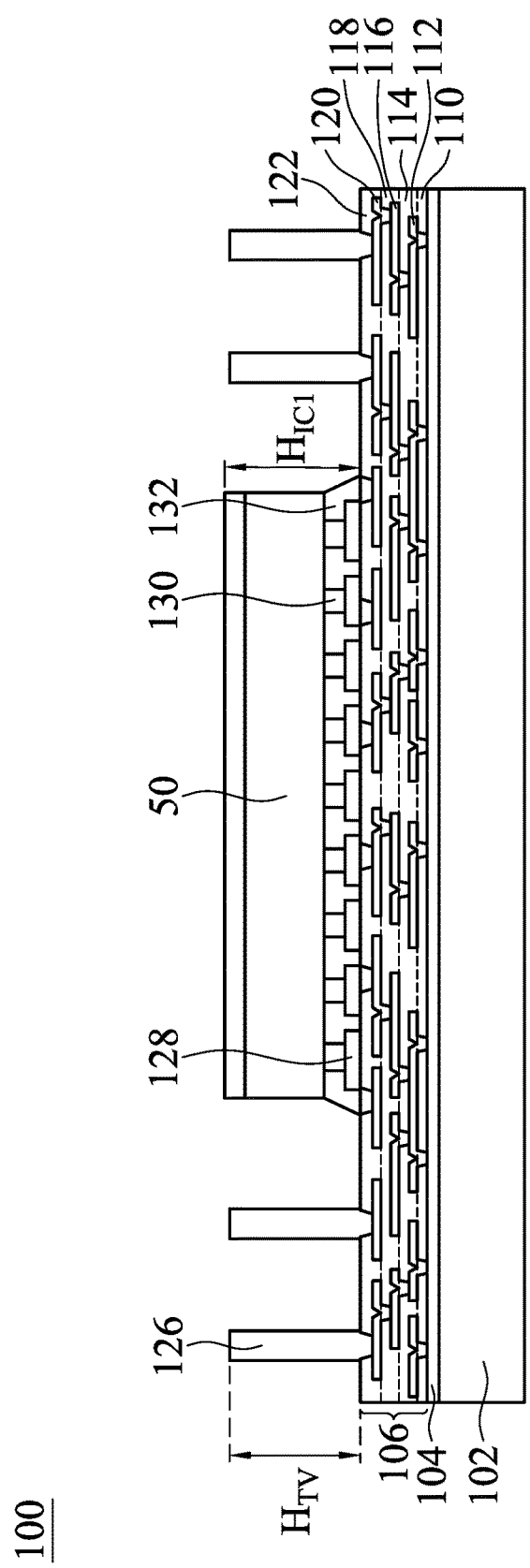

In FIG. 2G, one or more semiconductor devices, such as the first integrated circuit die 50, are attached to the bond pads 128 to make electrical connection with the first-side redistribution structure 106. For example, the first integrated circuit die 50 may be attached by forming solder joints 130 over the die connectors 66 (whether conductive pillars or UBMs), pressing the die connectors 66 to the bond pads 128, and reflowing the solder joints 130 to attach the first integrated circuit die 50 to the first-side redistribution structure 106. In some embodiments, the first integrated circuit die 50 may be attached using direct metal-to-metal bonding or hybrid bonding. FIG. 2G depicts the integrated circuit die 50 as having a greater height than the through vias 126. However, it may be appreciated that the through vias 126 may have about the same height or a greater height than the integrated circuit die 50. For example, the through vias 126 may have a height $H_{TV}$ of about 10 µm to about 200 µm, and the integrated circuit die 50 may have a height $H_{IC1}$ of about 30 µm to about 250 µm. The ratio of height $H_{TV}$ to height $H_{IC1}$ may be about 0.04 to about 8.

It should be appreciated that the first-side redistribution structure 106 may be a fan-out redistribution structure with respect to the integrated circuit die 50. As such, the metallization patterns (e.g., the metallization patterns 112, 116, and 120) may extend further in a lateral direction than the integrated circuit die 50. The fan-out design allows for a thinner redistribution structure while also accommodating a greater number of external connectors, which may therefore also extend further in a lateral direction than the integrated circuit die 50. The first-side redistribution structure 106 is formed to a thickness $T_1$, which may be about 20 µm to about 100 µm.

An underfill material 132 may be dispensed between the first integrated circuit die 50 and the first-side redistribution structure 106. The underfill material 132 surrounds the solder joints 130 and bond pads 128. The underfill material 132 may be any acceptable material, such as a polymer, epoxy, molding underfill, or the like. The underfill material 132 may be dispensed using a needle or a jetting dispenser, using a capillary flow process, or using another suitable process. In some embodiments, a curing process may be performed to cure the underfill material 132. Although not explicitly shown in FIG. 2G, the underfill material 132 may extend along sidewalls of the first integrated circuit die 50.

FIG. 2G illustrates a single integrated circuit die 50 attached to the bond pads 128 for illustrative purposes. In some embodiments, two or more integrated circuit dies 50 (each having a same or a different functionality) may be attached to the bond pads 128.

FIGS. 3A through 3H illustrate cross-sectional views of intermediate steps during a process for forming a second component 200, in accordance with some embodiments. As discussed above, the second component 200 may be subsequently attached to the first component 100 discussed above with reference to FIGS. 2A-2G. The second component 200 may be formed as individual packages or through wafer-level processing. Only an individual package component 200 is illustrated, but it should be appreciated that the second component 200 may be part of a wafer. After formation, the individual second components 200 are singulated. The resulting second component 200 may also be referred to as an integrated package.

Figure 3A:
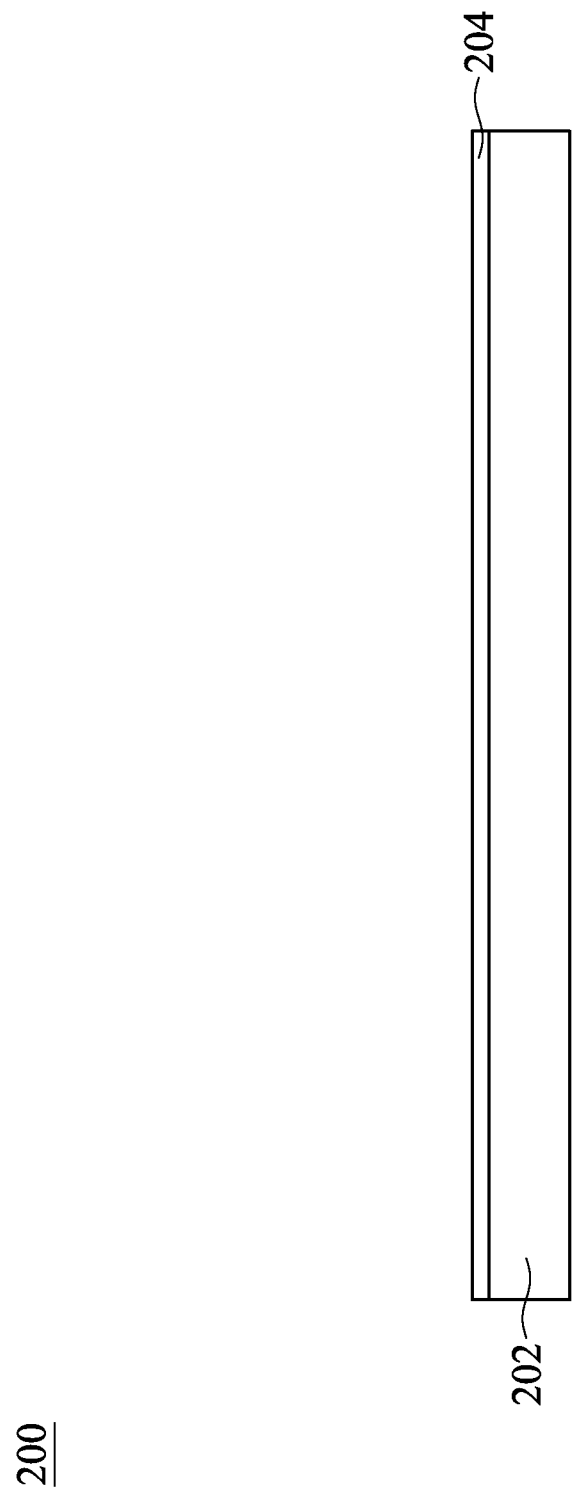
FIGS. 3A through 3H illustrate cross-sectional views of intermediate steps during a process for forming package components, in accordance with some embodiments.

In FIG. 3A, a second carrier substrate 202 is provided, and a second-side redistribution structure may be formed on the second carrier substrate 202. The second carrier substrate 202 may be a glass carrier substrate, a ceramic carrier substrate, or the like. The second carrier substrate 202 may be a wafer, such that multiple packages can be formed on the second carrier substrate 202 simultaneously. A first metal film 204 is formed on the second carrier substrate 202. The first metal film 204 may comprise copper, such as a copper foil. The second carrier substrate 202 may have a thickness of about 10 µm to about 400 µm, or about 200 µm. The first metal film 204 may have a thickness of about 1 µm to about 20 µm, or about 3 µm. The first metal film 204 may comprise copper or another conductive material.

Figure 3B:
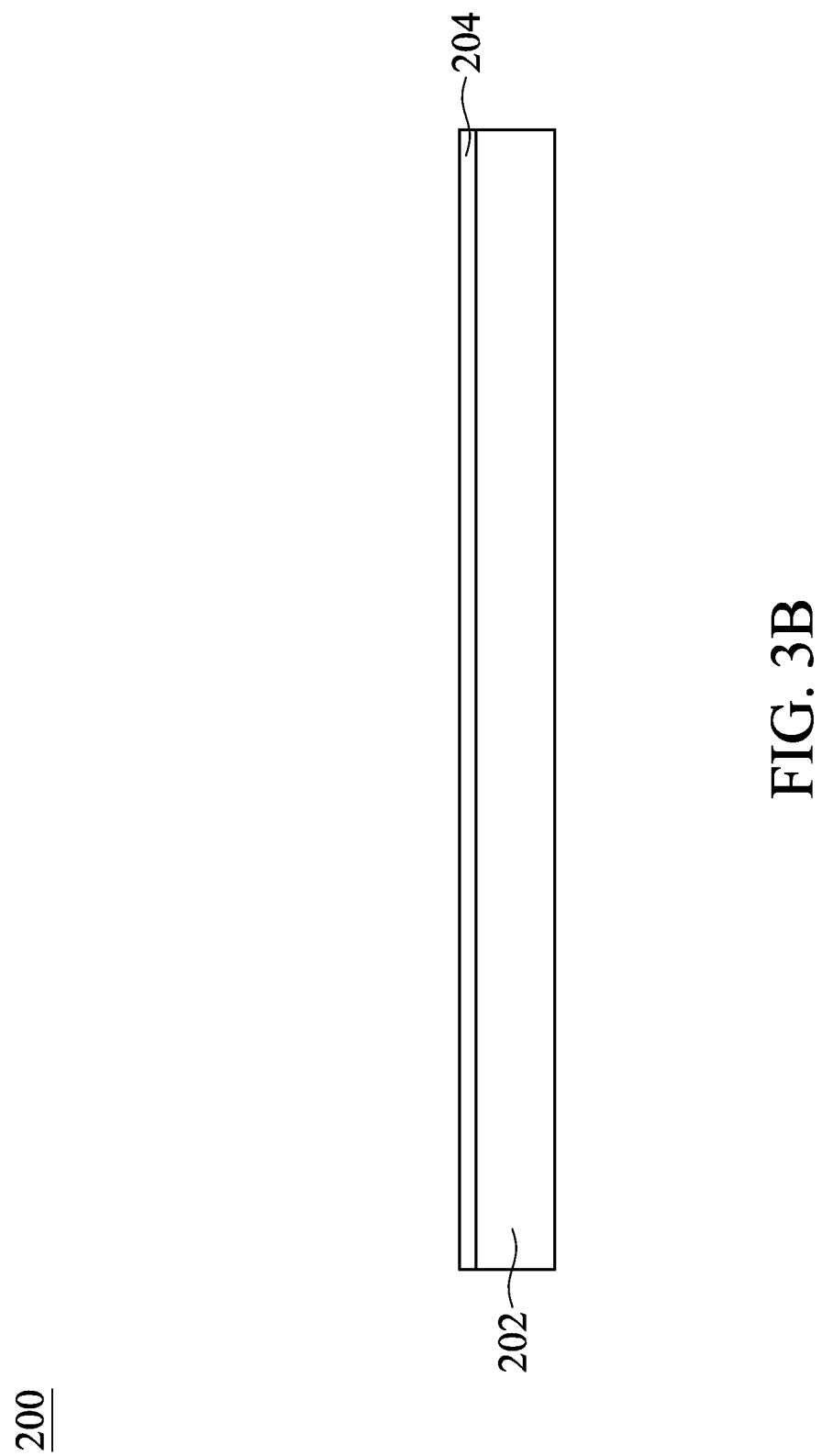

In FIG. 3B, a photoresist 208 is then formed and patterned on the first metal film 204. The photoresist 208 may be formed by spin coating or the like and may be exposed to light for patterning. The patterning forms openings through the photoresist 208 to expose the first metal film 204.

Figure 3C:
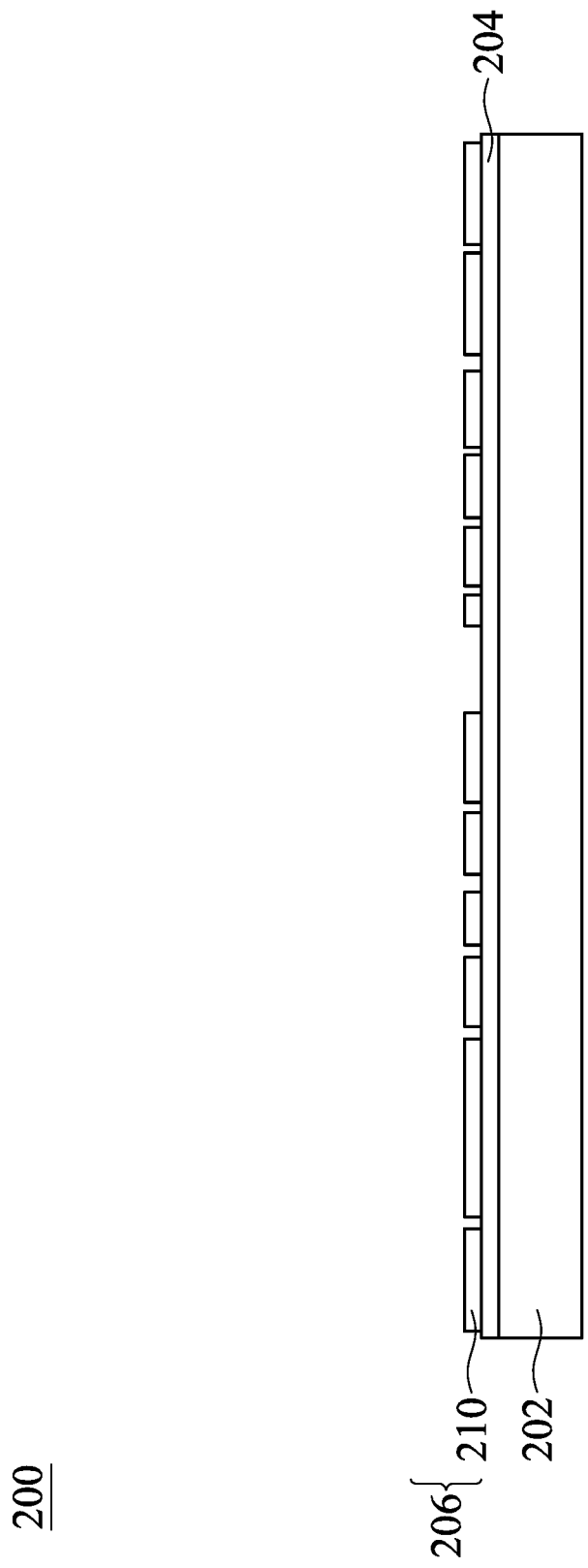

In FIG. 3C, a second-side redistribution structure 206 is formed over the first metal film 204. First, a first metal trace 210 is formed over the first metal film 204, and the photoresist 208 is removed. The first metal trace 210 may be formed by electro-plating and may comprise one or more layers of conductive material. For example, a layer of gold (Au) may be deposited first, a layer of nickel (Ni) next, and a layer of copper (Cu) last. The Au may be deposited at a thickness of greater than or about 0.1 µm, such as about 0.01 µm to about 3 µm. The nickel may be deposited at a thickness of greater than or about 3 µm, such as about 0.1 µm to about 10 µm. The copper may be deposited at a thickness of greater than or about 7 µm, such as about 1 µm to about 25 µm. As such, the first metal trace 210 may have a thickness of greater than or about 1 µm to about 35 µm, such as greater than or about 10 µm. Thicknesses such as these provide the benefit of adhering the first metal trace 210 to the first metal film 204, maintaining internal cohesiveness, and/or allowing sufficient conductive properties. Thicknesses less than these may result in poorer adhesiveness, cohesiveness, and/or conductivity. The photoresist 208 may be removed by any suitable stripping method.

Figure 3D:
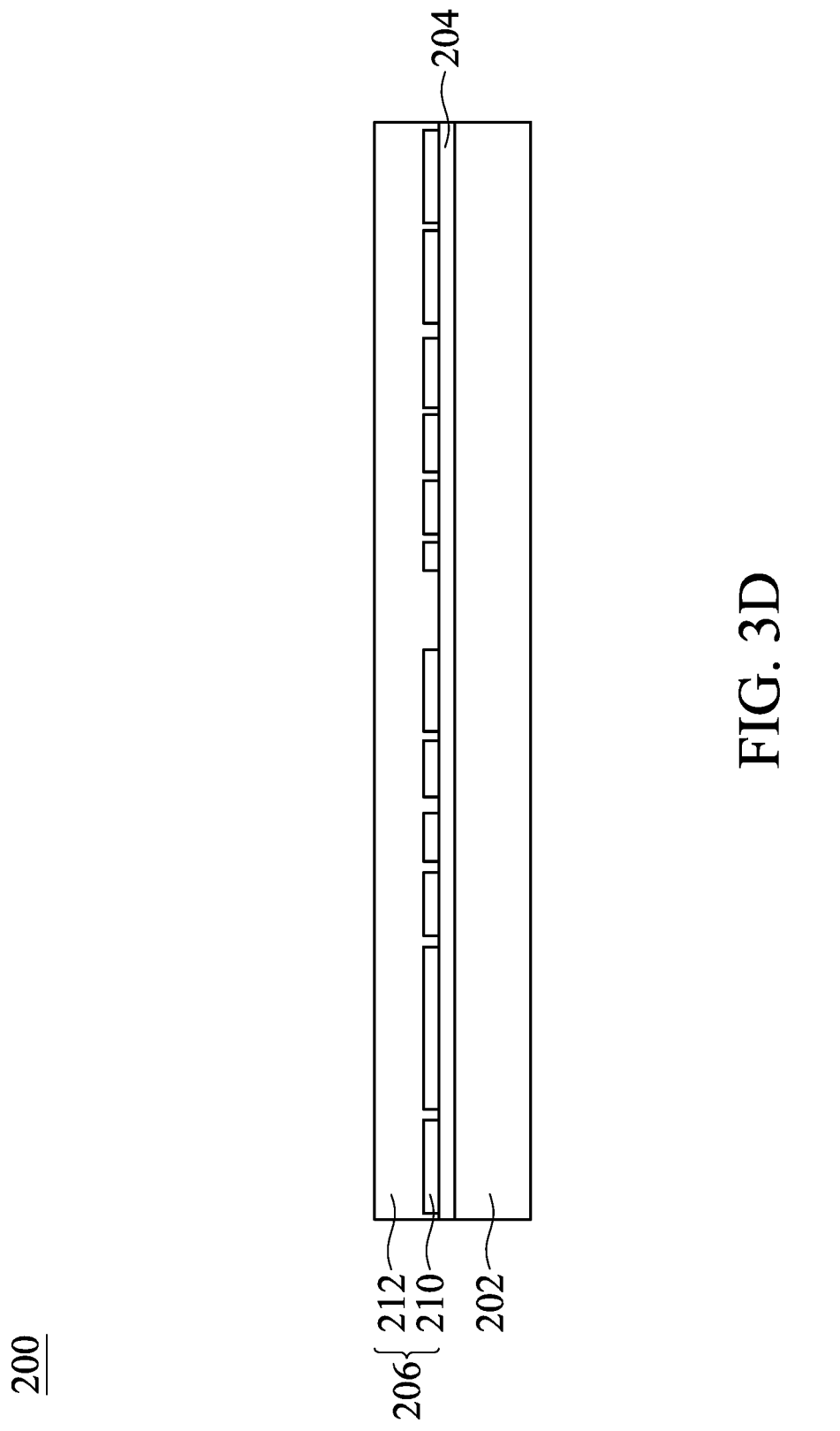

In FIG. 3D, a dielectric layer 212 is formed over the first metal trace 210. The dielectric layer 212 may be formed by a thermal lamination process. The dielectric layer 212 may comprise prepreg or Ajinomoto Build-up Film (ABF). In some embodiments, the dielectric layer 212 may be prepreg with a thickness of about 10 µm to about 100 µm, such as about 30 µm, or ABF with a thickness of about 10 µm to about 100 µm, such as about 20 µm. A benefit of using prepreg or ABF material as the dielectric layer 212 is that the second-side redistribution structure 206 will have a high level of strength and reliability. When later coupled with the first-side redistribution structure 106, the overall semiconductor package will be less susceptible to warpage.

Figure 3E:
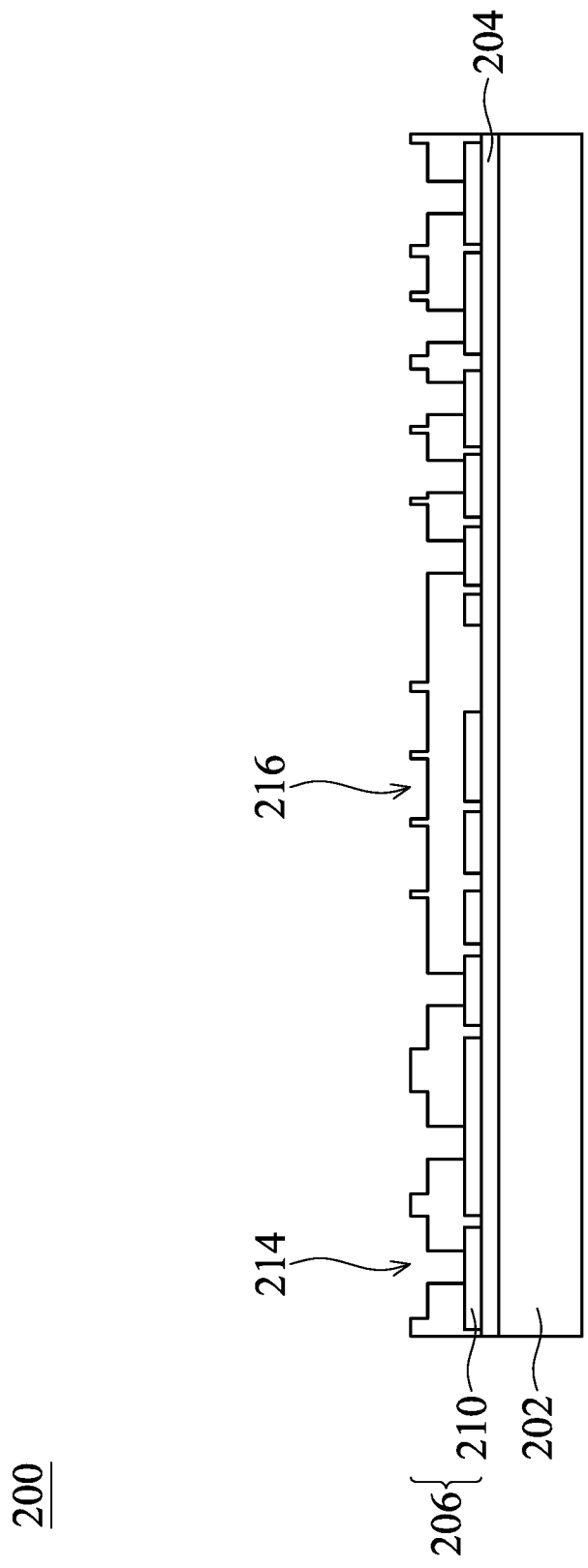

In FIG. 3E, the dielectric layer 212 is patterned to form openings exposing portions of the first metal trace 210. The openings include via openings 214 extending through the dielectric layer 212 to expose a portion of the first metal trace 210. The openings further include line openings 216 that connect with the via openings 214 and provide routing capabilities. The dielectric layer 212 can be patterned using a single damascene or a dual damascene process. The patterning may be performed by any suitable method, such as forming a photoresist and wet or dry etching the dielectric layer 212 and/or employing a laser ablation (or laser drilling) technique. Although depicted with vertical sidewalls, it should be appreciated that a laser drilling technique may result in the via openings 214 having non-vertical sidewalls. The via openings 214 may have a width of about 30 µm to about 150 µm, such as about 65 µm.

Figure 3F:
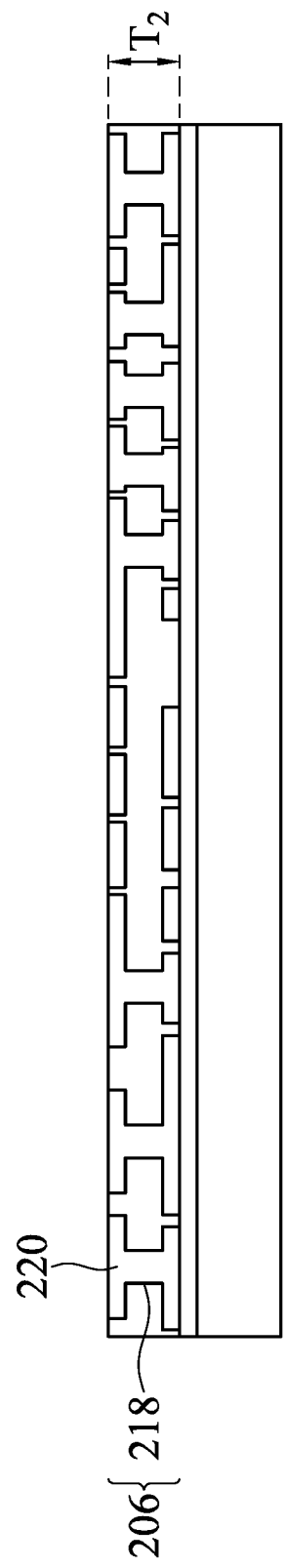

In FIG. 3F, the via openings 214 and the line openings 216 in the upper region of the dielectric layer 212 are filled with a conductive material to form conductive vias 218 (in the via openings 214) and second metal traces 220 (in the line openings 216). The conductive material may be deposited by electro-plating or electroless-plating, or any suitable method. The second metal traces 220 may have a thickness of about 10 µm. Alternatively, the conductive vias 218 may be initially formed before the dielectric layer 212 is patterned to form the second metal trace 220.

The second-side redistribution structure 206 (comprising the first metal trace 210, the conductive vias 218, and the second metal trace 220) is formed to a thickness $T_2$, which may be about 20 µm to about 150 µm. Thickness $T_2$ of the second-side redistribution structure 206 may be greater than or equal to thickness $T_1$ of the backside redistribution structure 106. The ratio of thickness $T_2$ to thickness $T_1$ may be about 0.3 to about 3. A ratio in this range provides a suitable stiffness to prevent or reduce warpage due to the differences in the coefficient of thermal expansions (CTEs) of, for example, the dielectric layers and the metallization patterns of the first-side redistribution structure 106 when the second component 200 is subsequently attached to the first component 100, and the materials comprising the integrated circuit die 50. Ratios less than these values may not provide a sufficient stiffness for the second component 200 to counterbalance the expansion of the components of the first component 100. Ratios greater than these values may increase the signal lengths, thereby reducing the performance of the packaged device.

Figure 3G:
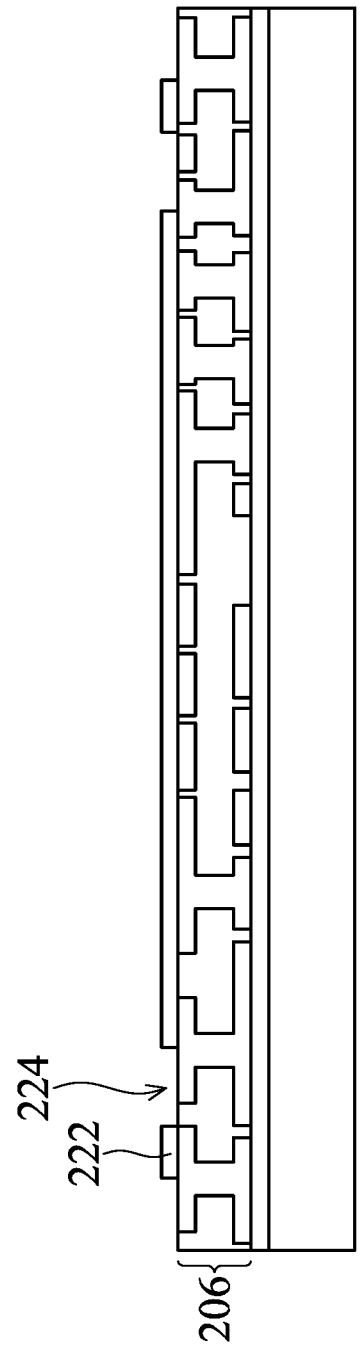

In FIG. 3G, a solder resist 222 is formed and patterned to form openings 224 exposing the conductive vias 218 and/or the second metal trace 220. In addition, the exposed portions of the conductive vias 218 and the second metal trace 220 may be treated for protective purposes. For example, an electroless nickel electroless palladium immersion gold (ENEPIG) treatment or an organic solderability preservative (OSP) may be performed on exposed portion of the conductive vias 218 and the second metal trace 220. The solder resist may have a thickness of about 5 µm to about 40 µm, such as about 10 µm. The solder resist 222 may also be used to protect areas of the second-side redistribution structure 206 from external damage.

Figure 3H:
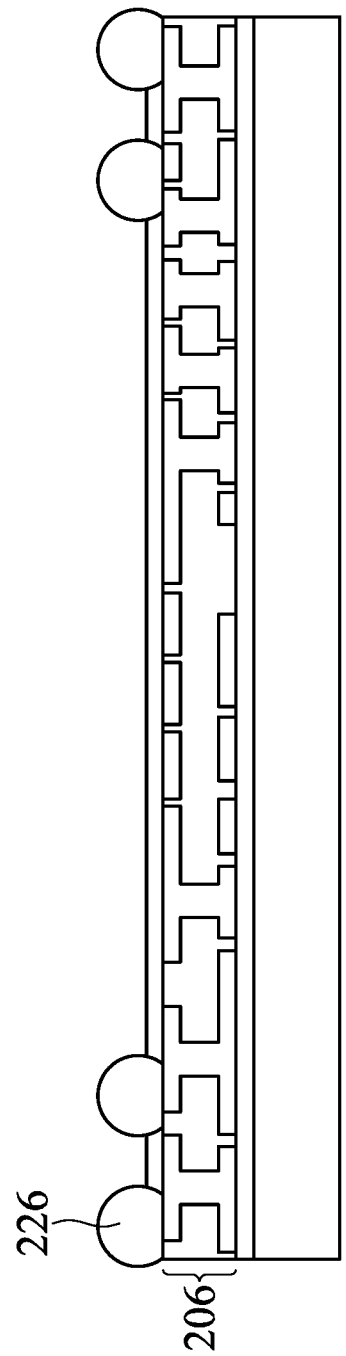

In FIG. 3H, connectors 226 are formed over the exposed portions of the conductive vias 218 and the second metal trace 220. The connectors 226 may be solder balls formed in a manner similar to the solder regions on the first integrated circuit die 50, and may be formed of a similar material as the solder regions on the first integrated circuit die 50.

In the case of wafer level processing to form the second component 200, a singulation process may be performed by sawing along scribe regions between adjacent second components 200. As discussed below the resulting, singulated second component 200 is coupled to the first component 100. In some embodiments, the first component 100 is similarly singulated before the second component 200 is attached. In some embodiments, the first component 100 is singulated after attaching the second component 200.

FIGS. 4A through 4H illustrate cross-sectional views of intermediate steps for attaching the second component 200 to the first component 100, as well as additional processing, to form a package 400, in accordance with some embodiments.

Figure 4A:
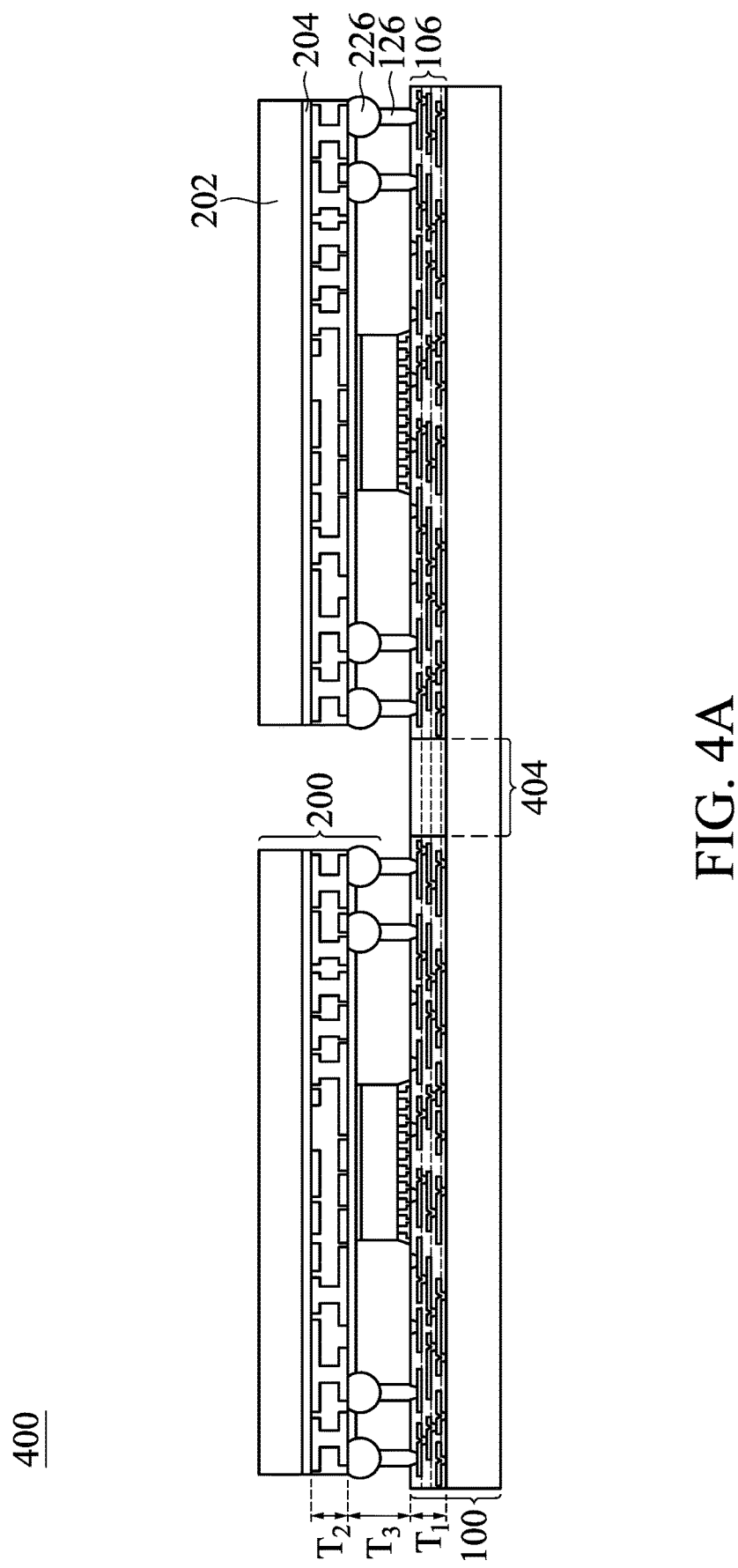

Referring first to FIG. 4A, the package 400 is illustrated in which the first component 100 is part of a wafer. In some embodiments (but not illustrated in FIG. 4A), the first component 100 has already been singulated at the scribe region 404.

Each singulated second component 200 is mounted to a first component 100 using the connectors 226. As discussed above, the first component 100 includes through vias 126 for attachment. As such, the connectors 226 are bonded to corresponding through vias 126. In some embodiments, the connectors 226 are reflowed to attach the second component 200 to the through vias 126. The connectors 226 electrically couple the second component 200 to the first-side redistribution structure 106 of the first package component 100. The connectors 226 may have an epoxy flux (not shown) formed thereon before they are reflowed with at least some of the epoxy portion of the epoxy flux remaining after the second component 200 is attached to the first component 100. This remaining epoxy portion may act as an underfill to reduce stress and protect the joints resulting from the reflowing the connectors 226. After attaching the second component 200 to the first component 100, the first-side redistribution structure 106 and the second-side redistribution structure 206 may be separated from one another by a thickness $T_3$. The thickness $T_3$ may be about 50 µm to about 500 µm. The ratio of thickness $T_3$ to thickness $T_1$ may be about 0.4 to about 5. The ratio of thickness $T_3$ to thickness $T_2$ may be about 0.3 to about 4.

Figure 4B:
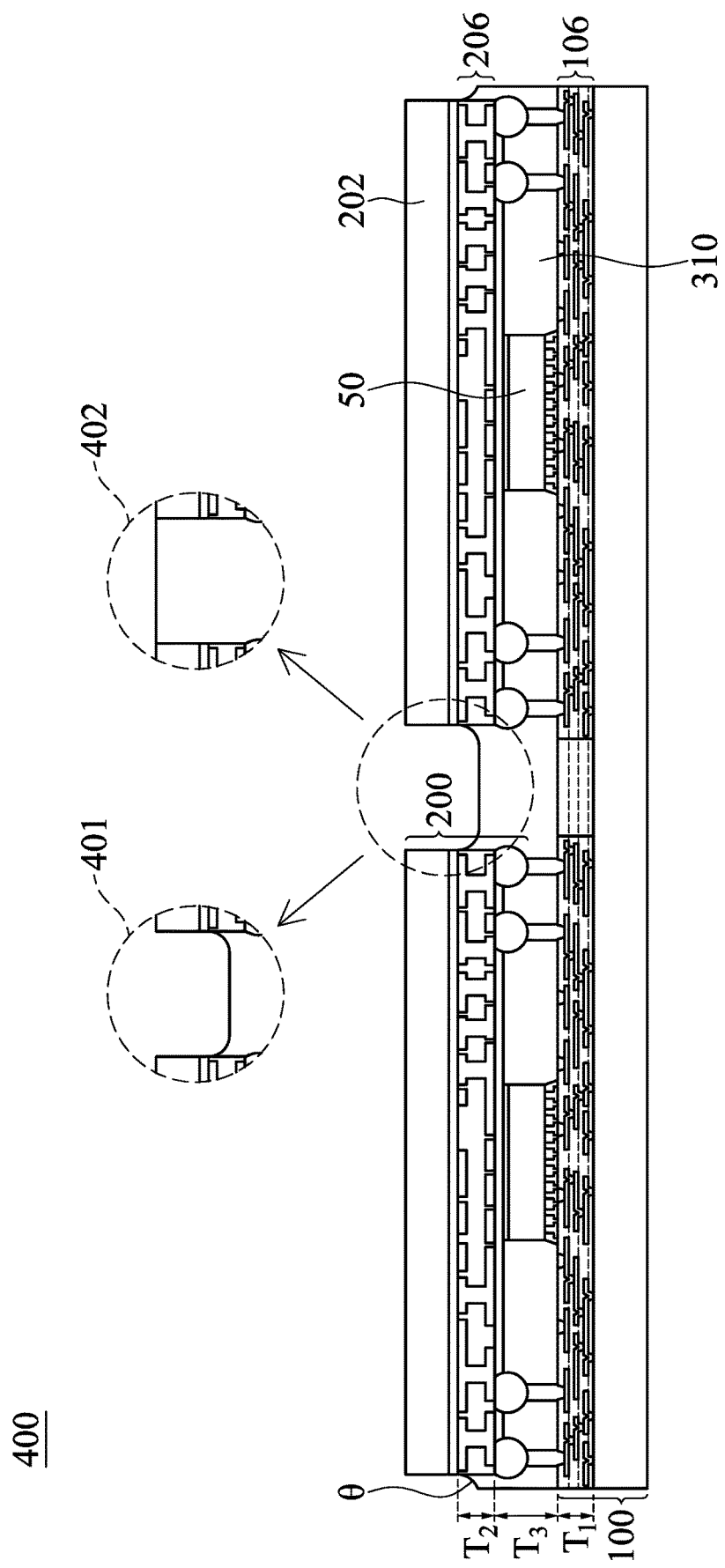

In FIG. 4B, an encapsulant 310 is formed over the first component 100 and below and around the second component 200. The encapsulant 310 further encapsulates the through vias 126, the first integrated circuit die 50, and any other devices (if any) attached to the first component 100 and/or the second component 200. The encapsulant 310 is further formed in gap regions between adjacent second components 200. The encapsulant 310 may be formed by a capillary flow process after the second package component 200 is attached or may be formed by a suitable deposition method before the second package component 200 is attached. In some embodiments, the encapsulant 310 may be applied by compression molding, transfer molding, or the like. The encapsulant 310 may be applied in liquid or semi-liquid form and then subsequently cured. The encapsulant 310 may be a molding compound, epoxy, or the like.

As represented in insets 401 and 402 of FIG. 4B, the encapsulant 310 may be formed around lateral edges of the second-side redistribution structure 206 of the second component 200. The encapsulant 310 may partially or completely cover a lateral edge of the second component 200. For example, as depicted in inset 401, the encapsulant 310 may have a recessed upper surface with a highest point located proximate to a lateral edge of the second component 200. The encapsulant 310 may partially or completely cover a lateral edge of the second-side redistribution structure 206. In some embodiments, the encapsulant 310 may further cover a portion of a lateral edge of the second carrier substrate 202. In addition, a lowest point on the upper surface may be below the portion of the second-side redistribution structure 206 that is closest to the second carrier substrate 202. As depicted in inset 402, the encapsulant 310 may be formed to cover all of a lateral edge of the second-side redistribution structure 206 as well as all or part of a lateral edge of the second carrier substrate 202. In some embodiments, the encapsulant 310 may cover the entirety of the lateral edges of the second carrier substrate 202 and even part of an upper surface of the second carrier substrate 202 (not specifically illustrated).

The encapsulant 310 provides additional support to the second-side redistribution structure 206, which makes the overall package 400 stronger, more reliable, and less susceptible to warpage. As discussed above, added strength and sturdiness come from the upper portion of the encapsulant 310 adhering to the lateral edges of the second component 200. The encapsulant 310 may slope downward away from the lateral edges of the second component 200 as depicted in inset 401 of FIG. 4B. The slope may have an angle θ from the horizontal. The angle θ may be about 0 degrees to about 45 degrees, or about 45 to about 60 degrees.

Figure 4C:
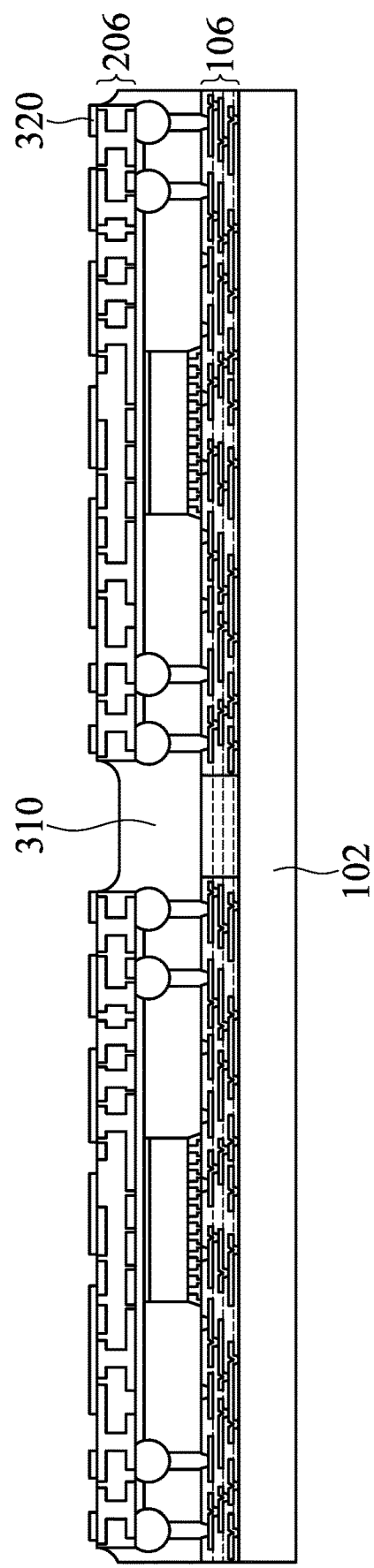

In FIG. 4C, the second carrier substrate 202 is removed from the package 400 exposing the second-side redistribution structure 206, in accordance with some embodiments. The second carrier substrate 202 may be demounted, debonded, or mechanically peeled off from the second-side redistribution structure 206 using, e.g., a thermal process to alter the adhesive properties of a release layer disposed on the second carrier substrate 202. In some embodiments an energy source such as an ultraviolet (UV) laser, a carbon dioxide ($CO_2$) laser, or an infrared (IR) laser, is utilized to irradiate and heat the release layer until the release layer loses at least some of its adhesive properties. Once performed, the second carrier substrate 202 and the metal film 204 may be physically separated and removed from the second-side redistribution structure 206. In some embodiments, a planarization process or a mechanical peel-off process is performed to remove the second carrier substrate 202 to expose the second-side redistribution structure 206. The planarization process may also remove some of the encapsulant 310 that may have been formed above an upper level of the second-side redistribution structure 206. The planarization process may be, for example, a chemical-mechanical polish (CMP), a grinding process, or the like. It should be noted that, even in embodiments in which the encapsulant 310 is formed to completely cover the lateral edge of the second component (and perhaps over the upper surface of the second carrier substrate 202 (e.g., as generally depicted in inset 402 of FIG. 4B)), the package 400 is not susceptible to mold creep of the encapsulant 310 over an upper surface of the second-side redistribution structure 206 due to the protection of the second carrier substrate 202. As such, after removal of the second carrier substrate 202, the upper surface of the second-side redistribution structure 206 is free of the encapsulant 310. As such, a topmost surface of the encapsulant 310 may be level with or recessed from the upper surface of the second-side redistribution structure 206.

Still referring to FIG. 4C, in some embodiments, passivation layer 320 is formed and patterned over the exposed second-side redistribution structure 206. The passivation layer 320 may be a dielectric material formed in a manner and of a material similar to any one of the dielectric layers 110, 114, 118, and 122. Alternatively, the passivation layer 320 may be a solder resist formed in a manner and of a material similar to the solder resist 222.

Figure 4D:
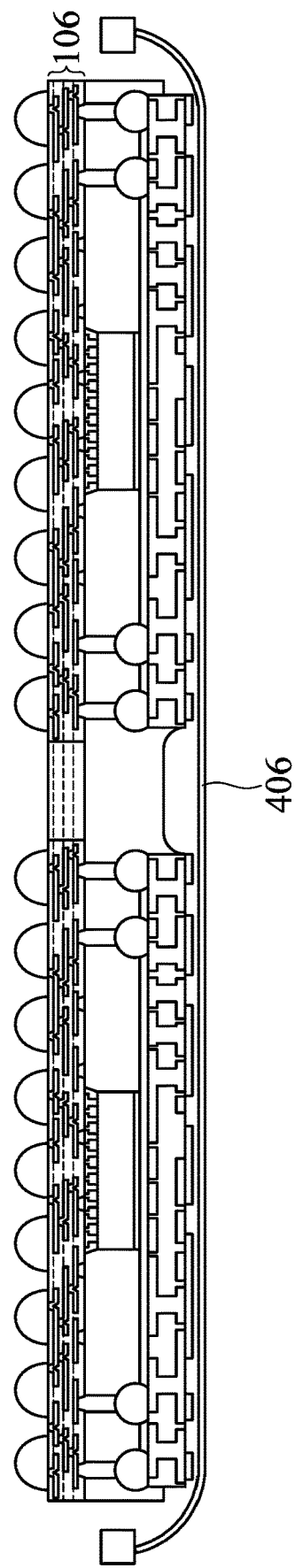

In FIG. 4D, the package 400 may be flipped over and attached to a temporary substrate 406, such as a tape, wafer, panel, frame, ring, or the like. The first carrier substrate 102 is then removed. In some embodiments, a carrier substrate de-bonding is performed to detach (or demount or de-bond) the first carrier substrate 102 from the first-side redistribution structure 106, e.g., the dielectric layer 110. In accordance with some embodiments, the de-bonding includes projecting a light such as a laser light or an UV light on the release layer 104 so that the release layer 104 decomposes under the heat of the light and the first carrier substrate 102 can be removed.

Figure 4E:
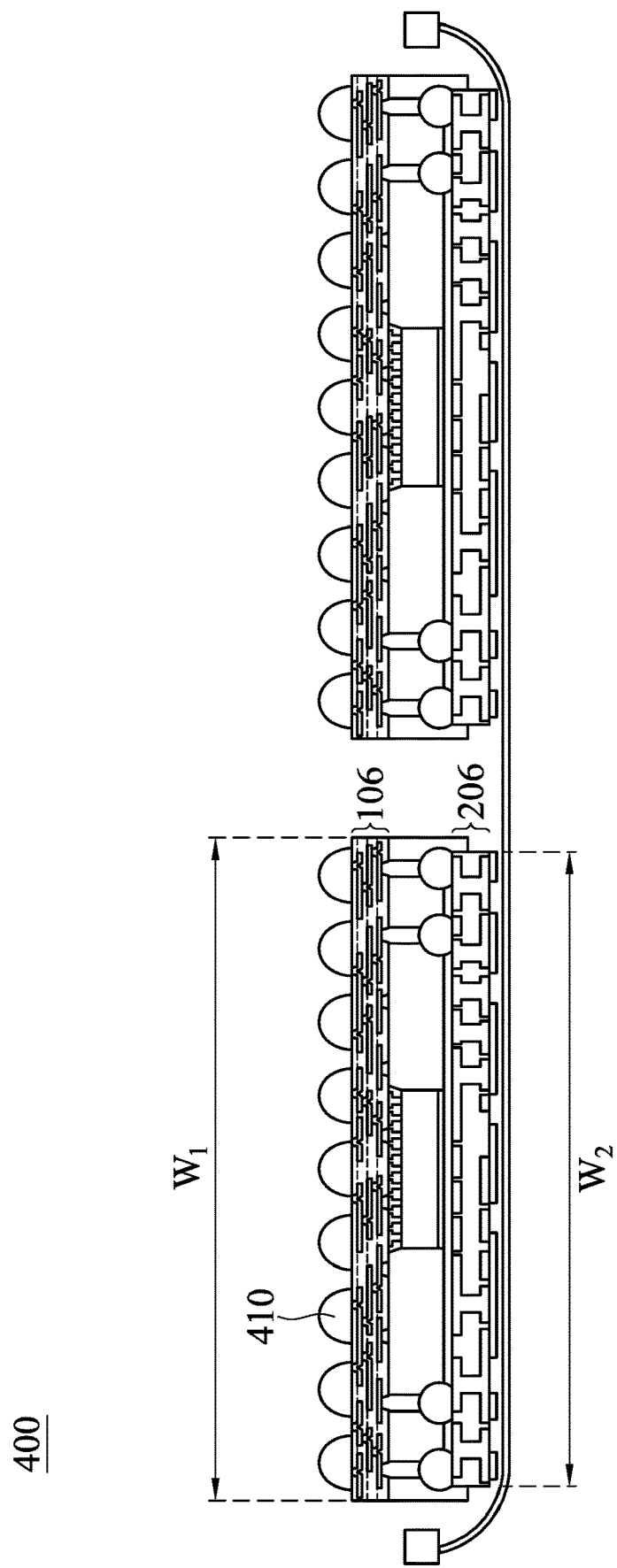

In FIG. 4E, conductive connectors 410 are formed on the first-side redistribution structure 106. The conductive connectors 410 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 410 may include a conductive material such as solder, copper, aluminum, gold, nickel, silver, palladium, tin, the like, or a combination thereof. In some embodiments, the conductive connectors 410 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 410 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

If it has not already, the structure may then be singulated along the scribe region 404 (see, e.g., FIG. 4A) to form individual packages 400, in accordance with some embodiments. Alternatively, the structure is singulated before forming conductive connectors 410. In some embodiments, the structure may be singulated using one or more saw blades that separate the package 400 into discrete pieces, forming one or more singulated packages 400. However, any suitable method of singulation, including laser ablation or one or more wet etches, may also be utilized.

After singulation, the first-side redistribution structure 106 has a width $W_1$, which may be about 3 mm to about 150 mm. The second component 200 and its second-side redistribution structure 206 has a width $W_2$, which may be about 3 mm to about 150 mm. The width $W_2$ may be less than or equal to width $W_1$ (e.g., the width of the first component 100 and its first-side redistribution structure 106). The ratio of the width $W_1$ to the width $W_2$ may be about 1 to about 3, or about 1. A ratio in this range provides an overall semiconductor package less susceptible to warpage when the second-side redistribution structure 206 is coupled to the first-side redistribution structure 106. In other words, the strength of the second-side redistribution structure 206 and the width $W_2$ will balance out warpage that may otherwise occur from the first-side redistribution structure 106.

Figure 4G:
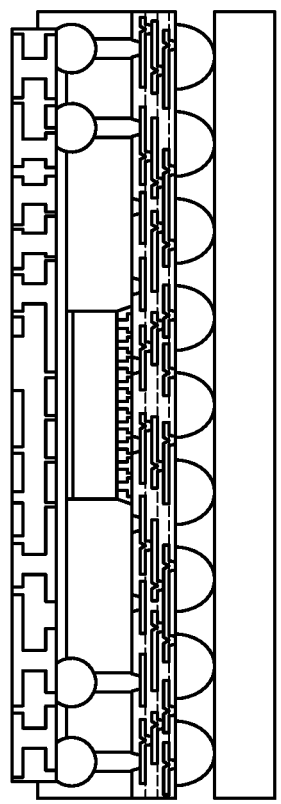
Figure 4F:
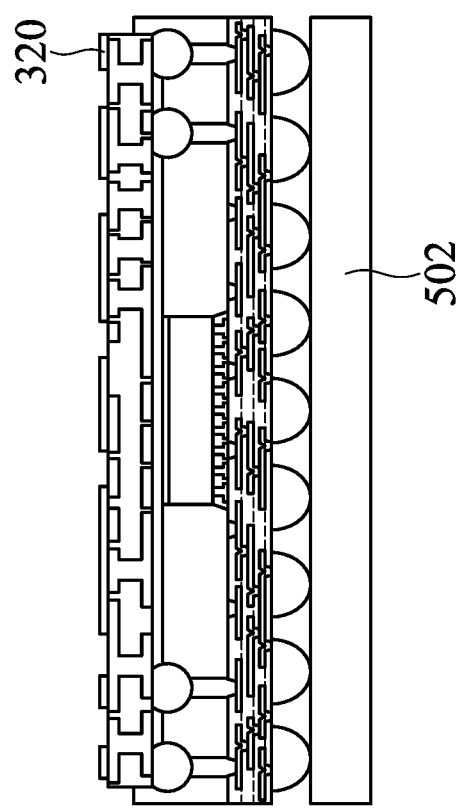

In FIGS. 4F and 4G, after singulation, the package 400 may be removed from the temporary substrate 406 and flipped over and attached to another substrate, such as substrate 502 (e.g., a carrier substrate, package substrate, PCB, or the like). As shown, the package 400 may feature the passivation layer 320 (FIG. 4F) or the passivation layer 320 may be omitted (FIG. 4G). In some cases within a package 400, the through via 126 may align with a conductive via 218 as depicted in the expanded portion of FIG. 4G. Depending on the method of formation, the conductive via 218 may have inwardly sloping sidewalls. In some cases the inwardly sloping sidewalls may have a concave shape giving the conductive via 218 an hourglass shape. In addition, the conductive via 218 may have tooth-like sidewalls. The tooth-like sidewalls may be due, in part, to the laser ablation method of drilling through the dielectric layer 212 as discussed above in connection with FIG. 3F.

In FIG. 4H, there is illustrated an embodiment similar to that discussed above with reference to FIG. 4F in which additional devices 510 are attached to the substrate 502. The additional devices 510 may include active devices and/or passive devices, such as integrated passive devices and surface mount devices (SMD) (e.g., capacitors). In addition, the additional devices 510 may include devices similar to the integrated circuit die 50 and devices designed for an intended purpose such as a memory die (e.g., a DRAM die, a stacked memory die, a high-bandwidth memory (HBM) die, etc.), a logic die, a central processing unit (CPU) die, a system-on-a-chip (SoC), a component on a wafer (CoW), an integrated fan-out structure (InFO), a package, the like, or a combination thereof.

FIGS. 5A through 5H and FIGS. 6A through 6H describe various intermediate steps in the formation of a first component (including a first integrated circuit die 50), formation of a second component (including attachment of a second integrated circuit die 50), and attaching the second component to the first component and further processing to form a semiconductor package, in accordance with some embodiments.

FIGS. 5A through 5H illustrate cross-sectional views of intermediate steps for forming a first component 501, a second component 502, and a package 504, in accordance with some embodiments. In particular, the figures depict certain intermediate steps in the formation of the first component 501, attachment of the second component 502 to the first component 501, as well as additional processing, to form a package 504.

Figure 5A:
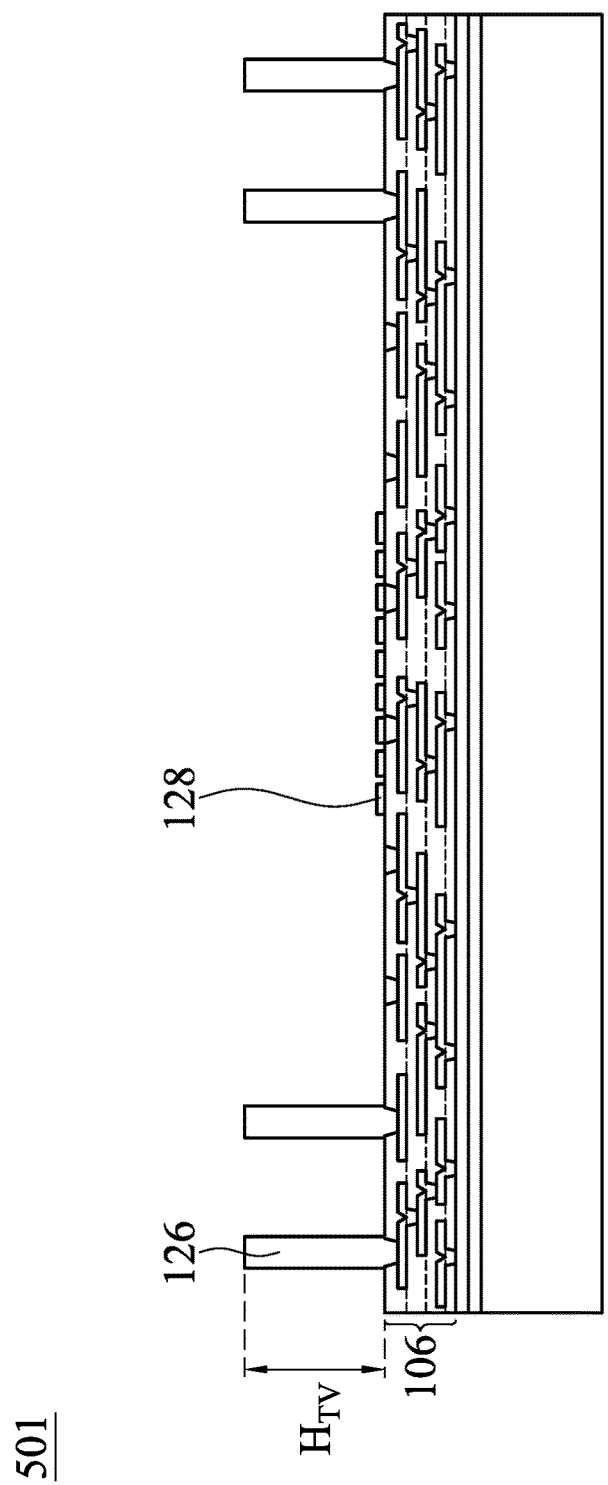
FIGS. 5A through 5H illustrate cross-sectional views of intermediate steps during a process for forming package components, in accordance with some embodiments.
Figure 5B:
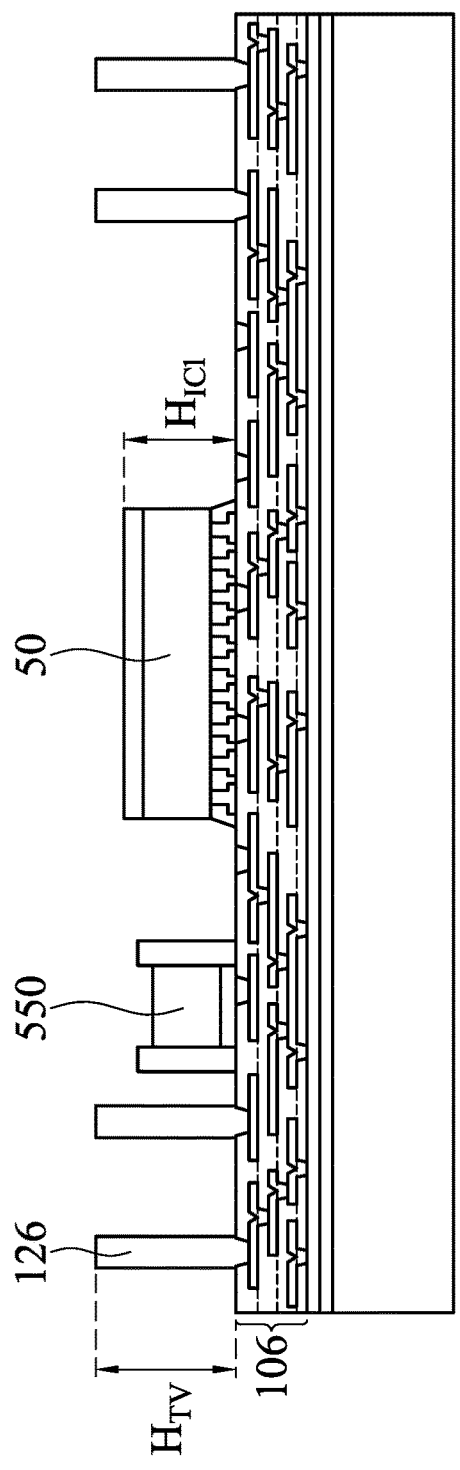

In FIG. 5A, the first-side redistribution structure 106 of the first component 501 has been provided, and through vias 126 and bond pads 128 have been formed over the first-side redistribution structure 106. Processes and materials similar to those discussed above with reference to FIGS. 2A-2F may be used. In FIG. 5B, the first integrated circuit die 50 has been attached along with one or more other semiconductor devices 550 (only one is illustrated, though there may be a plurality of additional semiconductor devices). Processes and materials similar to those discussed above with reference to FIG. 2G may be used.

The first integrated circuit die 50 and other devices 550 may include devices designed for an intended purpose such as a memory die (e.g., a DRAM die, a stacked memory die, a high-bandwidth memory (HBM) die, etc.), a logic die, a central processing unit (CPU) die, a system-on-a-chip (SoC), a component on a wafer (CoW), an integrated fan-out structure (InFO), a package, the like, or a combination thereof. The first integrated circuit die 50 and other devices 550 may be formed in processes of a same technology node, or may be formed in processes of different technology nodes. For example, the first integrated circuit die 50 may be of a more advanced process node than the other devices 550. The first integrated circuit die 50 and other devices 550 may have different sizes (e.g., different heights and/or surface areas), or may have the same size (e.g., same heights and/or surface areas). A benefit of the first-side redistribution structure 106 is to provide electrical connectivity between the integrated circuit die 50, the other devices 550, the subsequently attached second component 502, and components subsequently attached to the other side of the first-side redistribution structure 106.

In some embodiments, the first integrated circuit die 50 and other devices include transistors, capacitors, inductors, resistors, metallization layers, external connectors, and the like, therein, as desired for a particular functionality. In some embodiments, the first integrated circuit die 50 and other devices may include more than one of the same type of device, or may include different devices. FIG. 5B shows a single integrated circuit die 50, but in some embodiments one, two, or more integrated circuit dies 50 or other devices may be attached to the first-side redistribution structure 106. FIG. 5B depicts the integrated circuit die 50 as having a lesser height than the through vias 126. This is to accommodate the second component 502, which will include another integrated circuit die (as shown in later figures). For example, the through vias 126 may have a height $H_{TV}$ of about 10 µm to about 200 µm, and the integrated circuit die 50 may have a height $H_{IC1}$ of about 30 µm to about 250 µm. The ratio of height $H_{TV}$ to height $H_{IC1}$ may be about 0.04 to about 8.

Figure 5C:
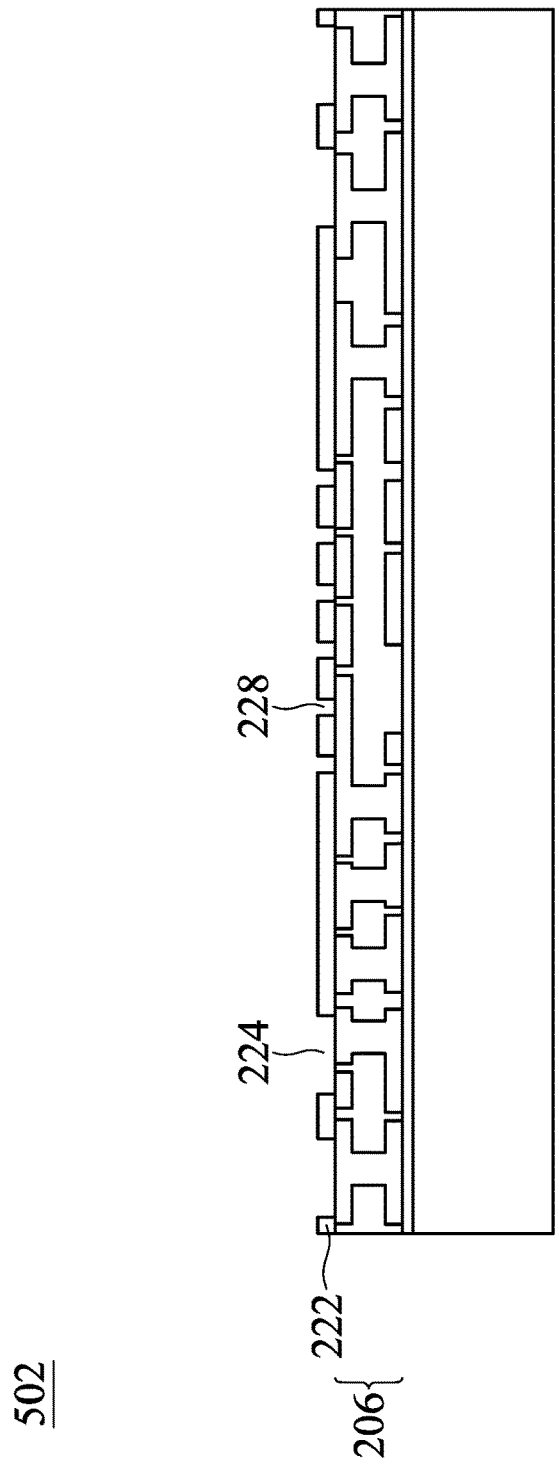

In FIG. 5C, the second-side redistribution structure 206 of the second component 502 has been provided, and the solder resist 222 may be formed and patterned to form openings 228 in addition to the openings 224. Processes and materials similar to those discussed above with reference to FIGS. 3A-3H may be used. Some or all of the openings 228 may expose portions of the conductive vias 218 and the second metal trace 220. The openings 228 may be formed at the same time as the openings 224 or at a different time using the same or different patterning method.

Figure 5D:
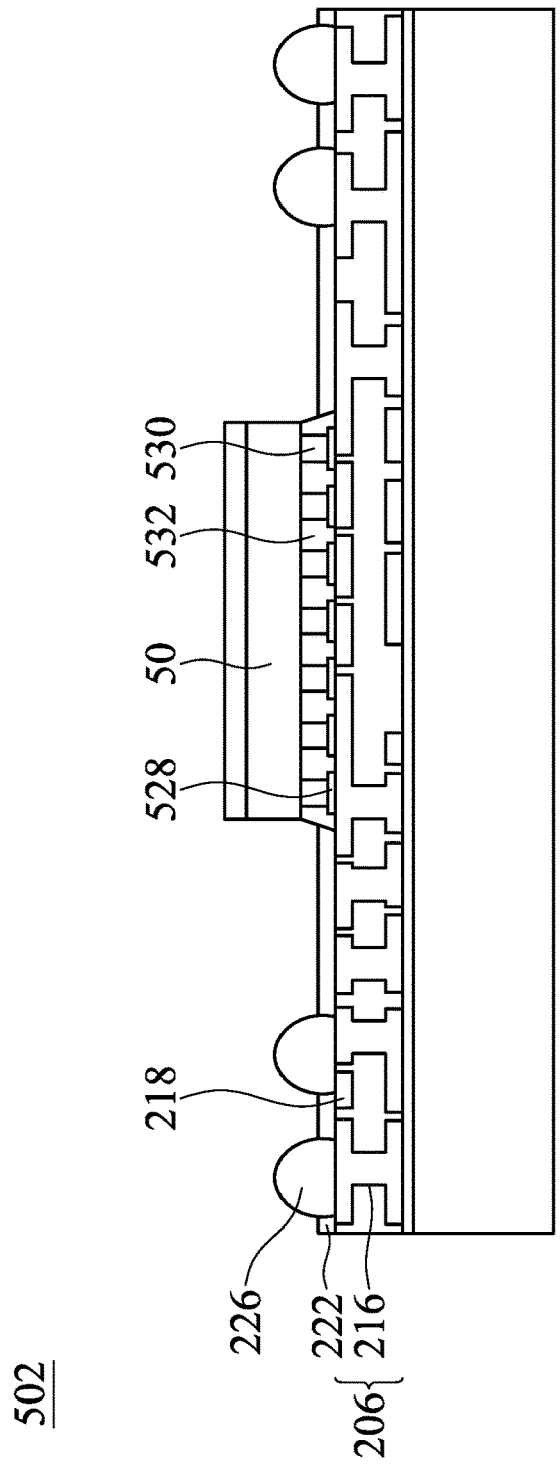

In FIG. 5D, a second integrated circuit die 50 may be attached to the second-side redistribution structure 206 at the openings 228 and electrically coupled to the conductive vias 218 and the second metal trace 220. Processes and materials similar to those discussed above with reference to FIGS. 2G and 5B may be used, including formation of bond pads 528, solder joints 53o, and underfill material 532. In addition, connectors 226 may be formed in the openings 224.

Figure 5E:
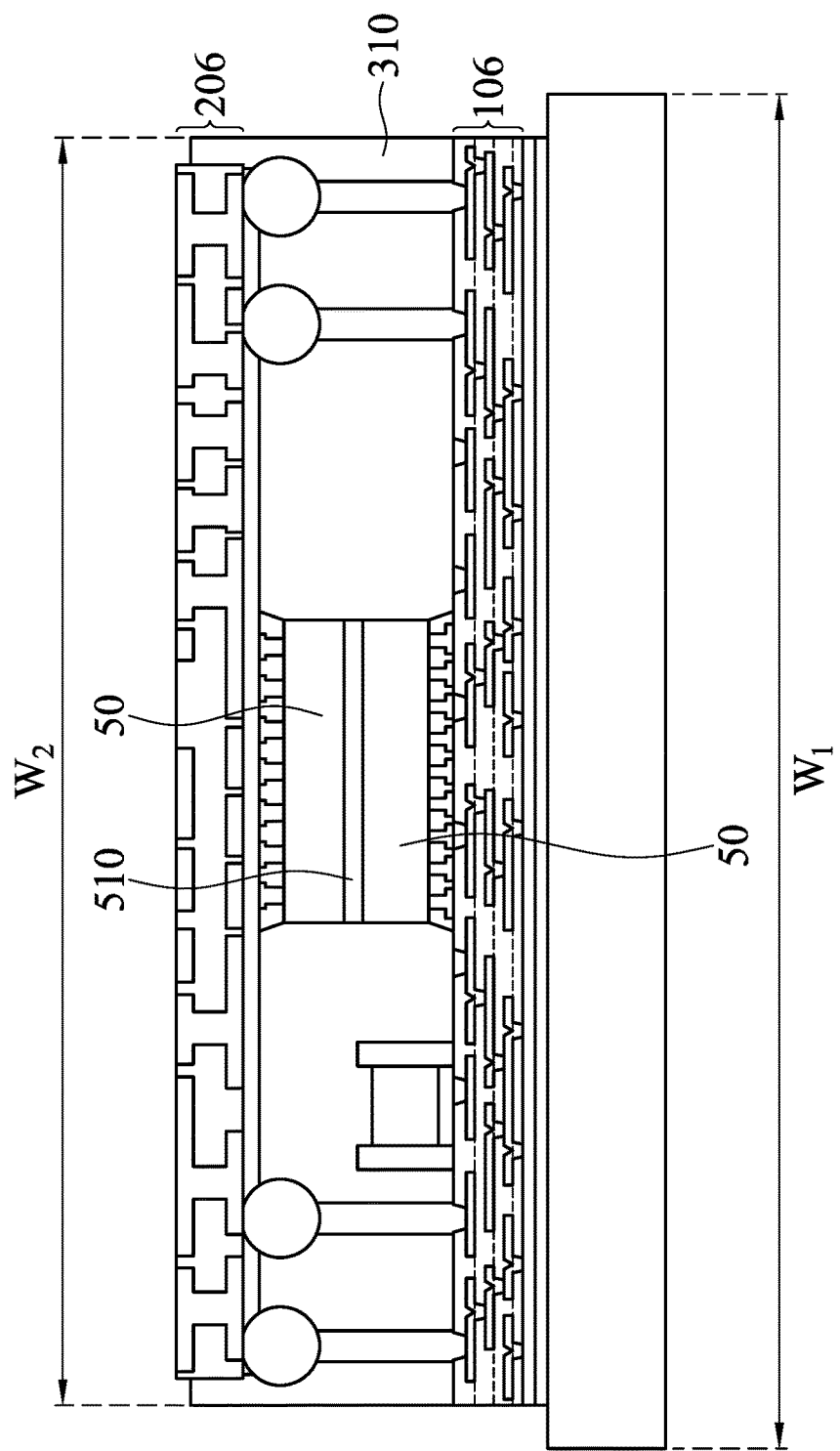

In FIG. 5E, the second component 502, comprising the second-side redistribution structure 206 and the second integrated circuit die 50, is attached to the first component 501 and the second carrier substrate 202 is removed using processes and materials similar to those discussed above with reference to FIGS. 4A through 4C. As discussed above in reference to the package 400, the package 504 may have the width $W_1$ of the first-side redistribution structure 106 greater than the width $W_2$ of the second-side redistribution structure 206, and the encapsulant 310 may be formed around lateral edges of the second-side redistribution structure 206, similarly as shown in FIGS. 4B through 4H. As shown, the second component 502 is attached such that the backsides of the first integrated circuit die 50 and the second integrated circuit die 50 face one another. Either or both of the first and the second integrated circuit dies 50 may have a dielectric layer 510 along the backside, which may then be directly interposed between the first and the second integrated circuit dies 50.

Still referring to FIG. 5E, the dielectric layer 510 may be similar to the adhesive layer 70 and applied in a similar manner. The first and the second integrated circuit dies 50 may be vertically aligned such that at least a portion of the second integrated circuit die 50 is directly over at least a portion of the first integrated circuit die 50. The first and the second integrated circuit dies 50 may be centered with one another or, alternatively, asymmetrically positioned.

Figure 5F:
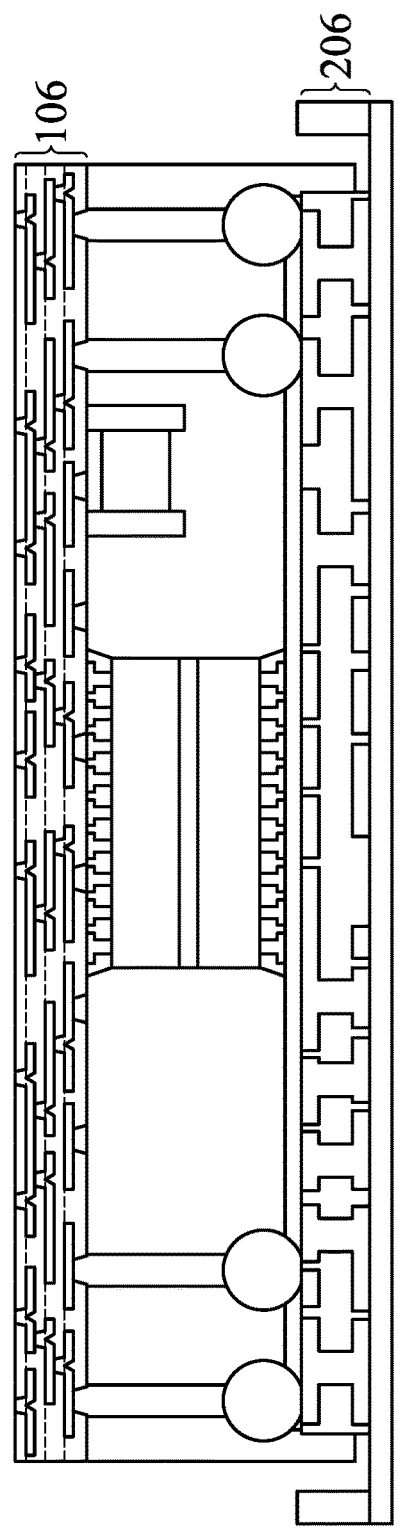
Figure 5G:
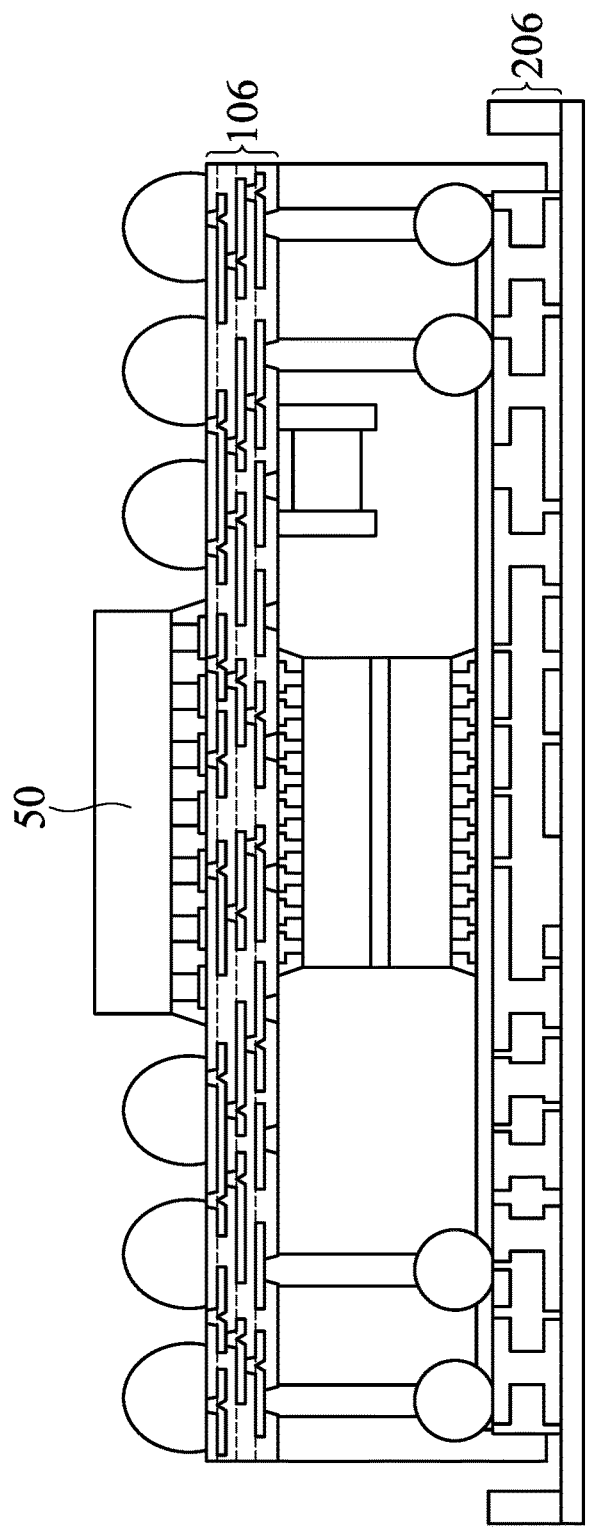
Figure 5H:
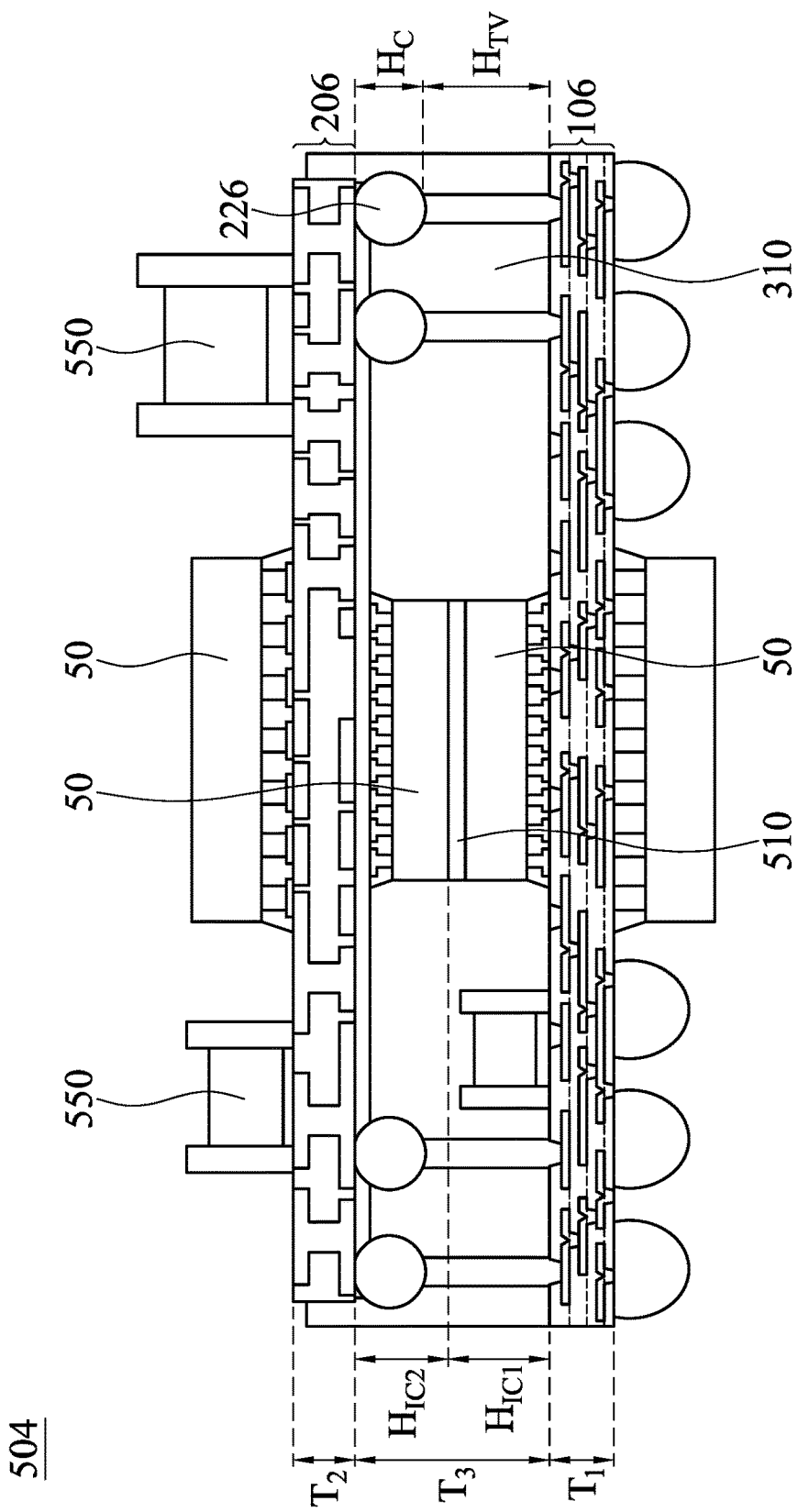

The package 504 may then be completed as shown in FIGS. 5F through 5H and in a similar manner as described above, such as in connection with FIGS. 4D through 4H. As shown in FIG. 5G, a third integrated circuit die 50 may be attached to the first-side redistribution structure 1o6 using processes and materials similar to those discussed above with reference to FIGS. 2G, 5B, and 5D. And as shown in FIG. 5H, a fourth integrated circuit die 50 and additional devices 55o may be attached to the second-side redistribution structure 206 using processes and materials similar to those discussed above with reference to FIGS. 2G, 4H, and 5D. A benefit of the depicted layout includes allowing for a narrower package 504 in the horizontal direction and/or providing more space along the first-side redistribution structure 106 to attach additional devices.

As discussed above, the first-side redistribution structure 106 and the second-side redistribution structure 206 are separated by the thickness $T_3$. In this embodiment, the thickness $T_3$ may be about 60 µm to about 500 µm. The ratio of thickness $T_3$ to thickness $T_1$ may be about 0.5 to about 25. The ratio of thickness $T_3$ to thickness $T_2$ may be about 0.4 to about 25. In addition, the connectors 226 may have a height $H_C$ that is about 10 µm to about 300 µm, or about 150 µm. As such, the total height of the through via 126 and the connector 226 in the package 504 may be about 50 µm to about 500 µm, or about 250 µm (noting that the total height may be less than the sum of the height $H_C$ and the height $H_{TV}$ due to reflowing the connector 226), which will be substantially the same as thickness $T_3$ of the region between the first-side redistribution structure 106 and the second-side redistribution structure 206. As further shown in FIG. 5H, the total height of the first integrated circuit die 50 and the second integrated circuit die (height $H_{IC1}$ and height $H_{IC2}$, respectively, plus a thickness of the dielectric layer 510) will be substantially the same as thickness $T_3$.

FIGS. 6A through 6H illustrate cross-sectional views of intermediate steps for forming the package 604, in accordance with some embodiments. In particular, the figures depict certain intermediate steps in the formation of the first component 601, attachment of the second component 602 to the first component 601, as well as additional processing, to form a package 604.

Figure 6A:
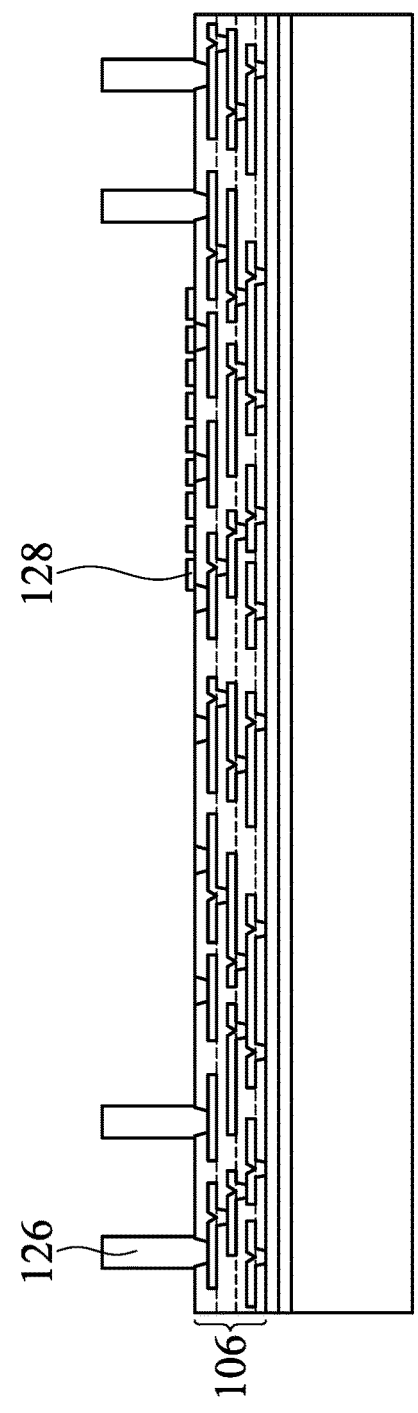
FIGS. 6A through 6H illustrate cross-sectional views of intermediate steps during a process for forming package components, in accordance with some embodiments.
Figure 6B:
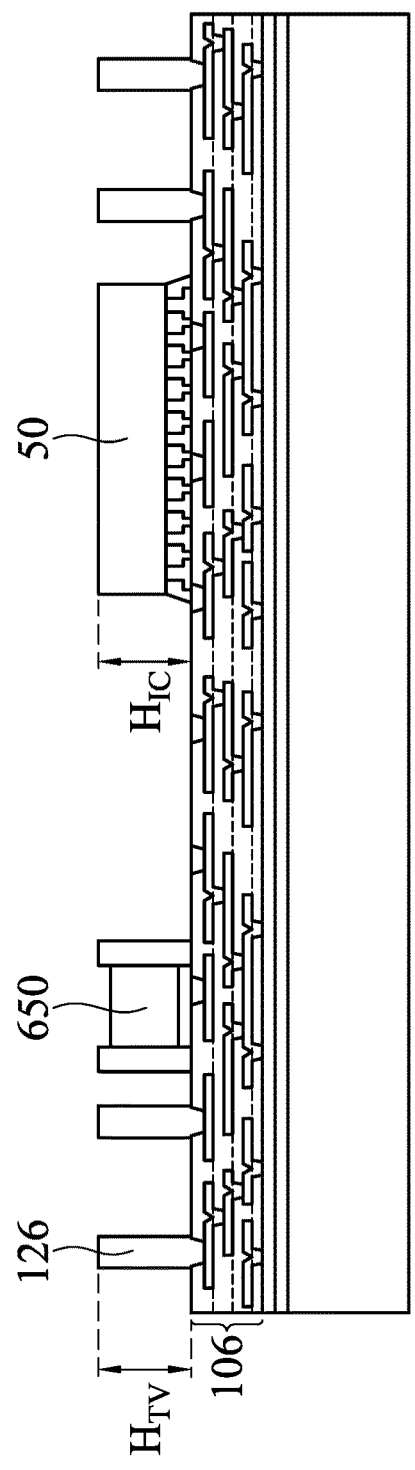

In FIG. 6A, the first-side redistribution structure 106 of the first component 601 has been provided, and through vias 126 and bond pads 128 have been formed over the first-side redistribution structure 106. Processes and materials similar to those discussed above with reference to FIGS. 2A-2F and 5A may be used. In FIG. 6B, the first integrated circuit die 50 is attached along with one or more other semiconductor devices 650. Processes and materials similar to those discussed above with reference to FIGS. 2G and 5B may be used. FIG. 6B depicts the integrated circuit die 50 as having a lesser height than the through vias 126. This is to accommodate the second component 602, which will include another integrated circuit die 50. For example, the through vias 126 may have a height $H_{TV}$ of about 10 µm to about 300 µm, and the integrated circuit die 50 may have a height $H_{IC1}$ of about 30 µm to about 300 µm. The ratio of height $H_{TV}$ to height $H_{IC1}$ may be about 0.03 to about 10.

Figure 6C:
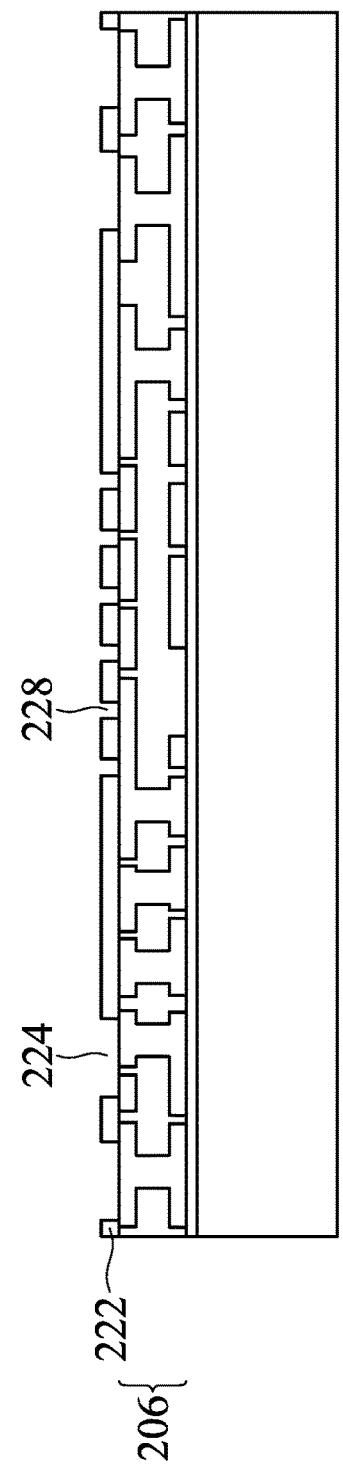

In FIG. 6C, the second-side redistribution structure 206 of the second component 602 has been provided, and the solder resist 222 may be formed and patterned to form openings 228 in addition to the openings 224. Processes and materials similar to those discussed above with reference to FIGS. 3A-3H and 5C may be used. Some or all of the openings 228 may expose portions of the conductive vias 218 and the second metal trace 220. The openings 228 may be formed at the same time as the openings 224 or at a different time using the same or different patterning method.

Figure 6D:
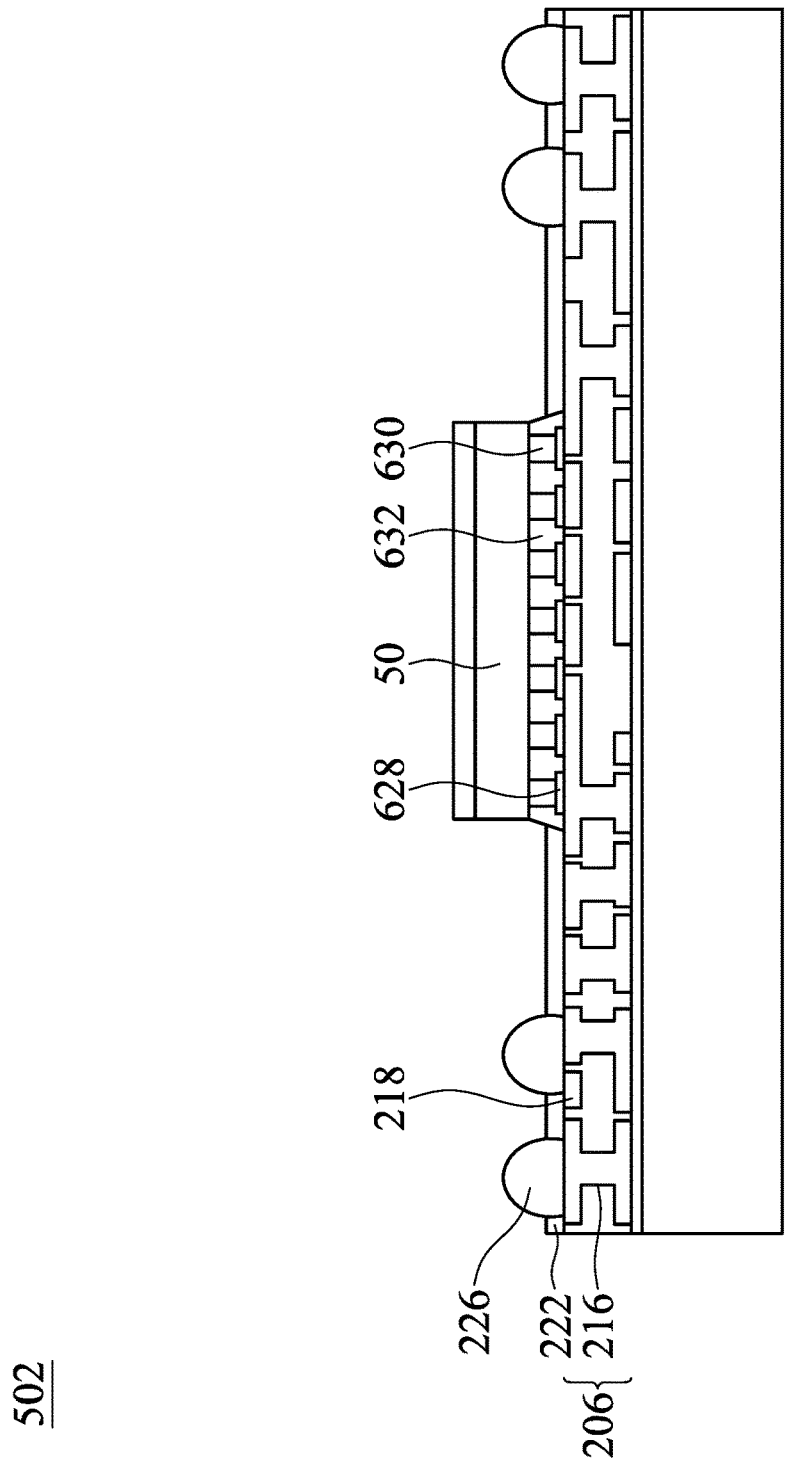

In FIG. 6D, a second integrated circuit die 50 may be attached to the second-side redistribution structure 206 at the openings 228 and electrically coupled to the conductive vias 218 and the second metal trace 220. Processes and materials similar to those discussed above with reference to FIGS. 2G, 5B, 5D, and 6B may be used, including formation of bond pads 628, solder joints 630, and underfill material 632.

Figure 6E:
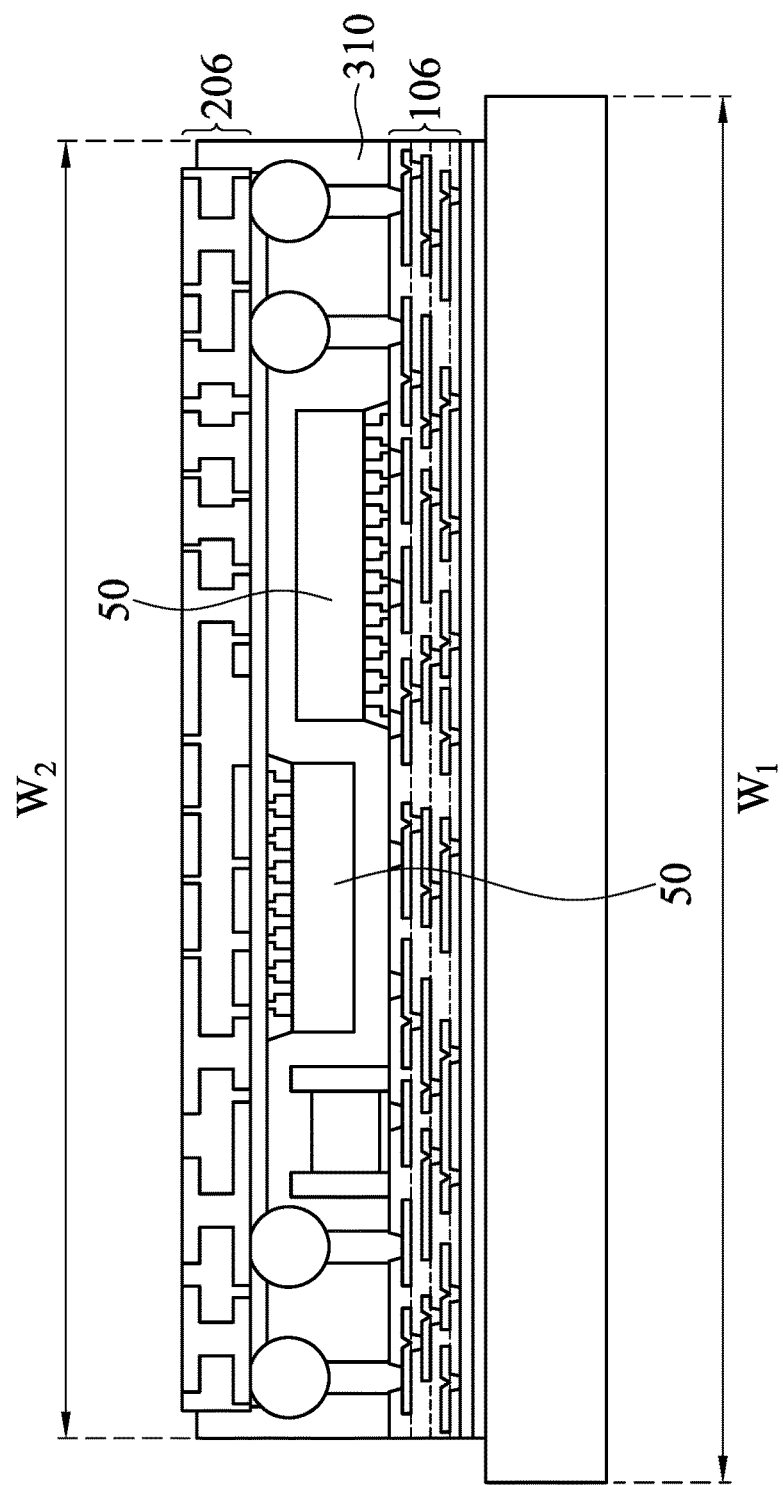

In FIG. 6E, the second component 602, comprising the second-side redistribution structure 206 and the second integrated circuit die 50, is attached to the first component 601 and the second carrier substrate 202 is removed using processes and materials similar to those discussed above with reference to FIGS. 4A through 4C and 5E. As discussed above in reference to the packages 400 and 504, the package 604 may have the width $W_1$ of the first-side redistribution structure 106 greater than the width $W_2$ of the second-side redistribution structure 206 and the encapsulant 310 may be formed around lateral edges of the second-side redistribution structure 206, similarly as shown in FIGS. 4B through 4H. As shown, the second component 602 is attached such that the second integrated circuit die 50 is laterally displaced from the first integrated circuit die 50. The lateral displacement allows for the backside surface of the second integrated circuit die 50 to be lower than the backside surface of the first integrated circuit die 50, although the backside surfaces may be at the same level or the backside surface of the second integrated circuit die 50 may be higher than the backside surface of the first integrated circuit die 50.

Figure 6F:
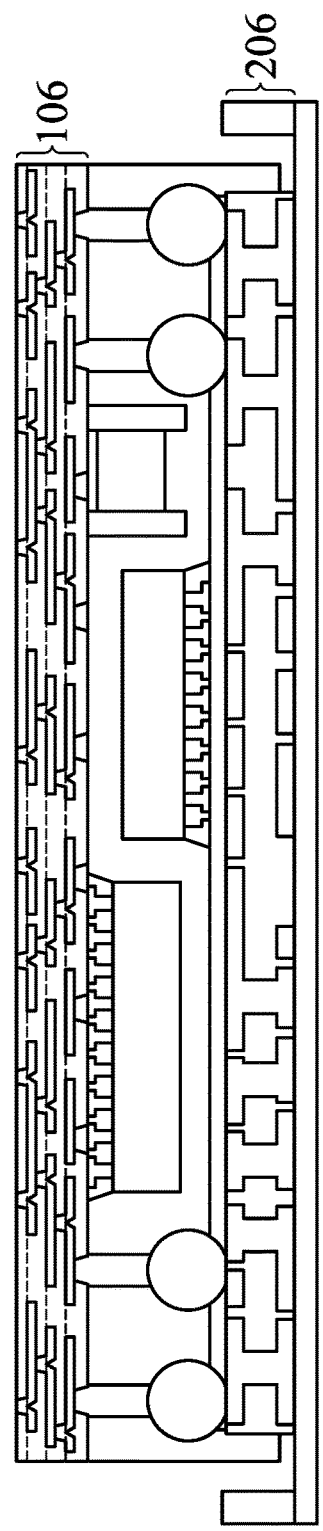
Figure 6G:
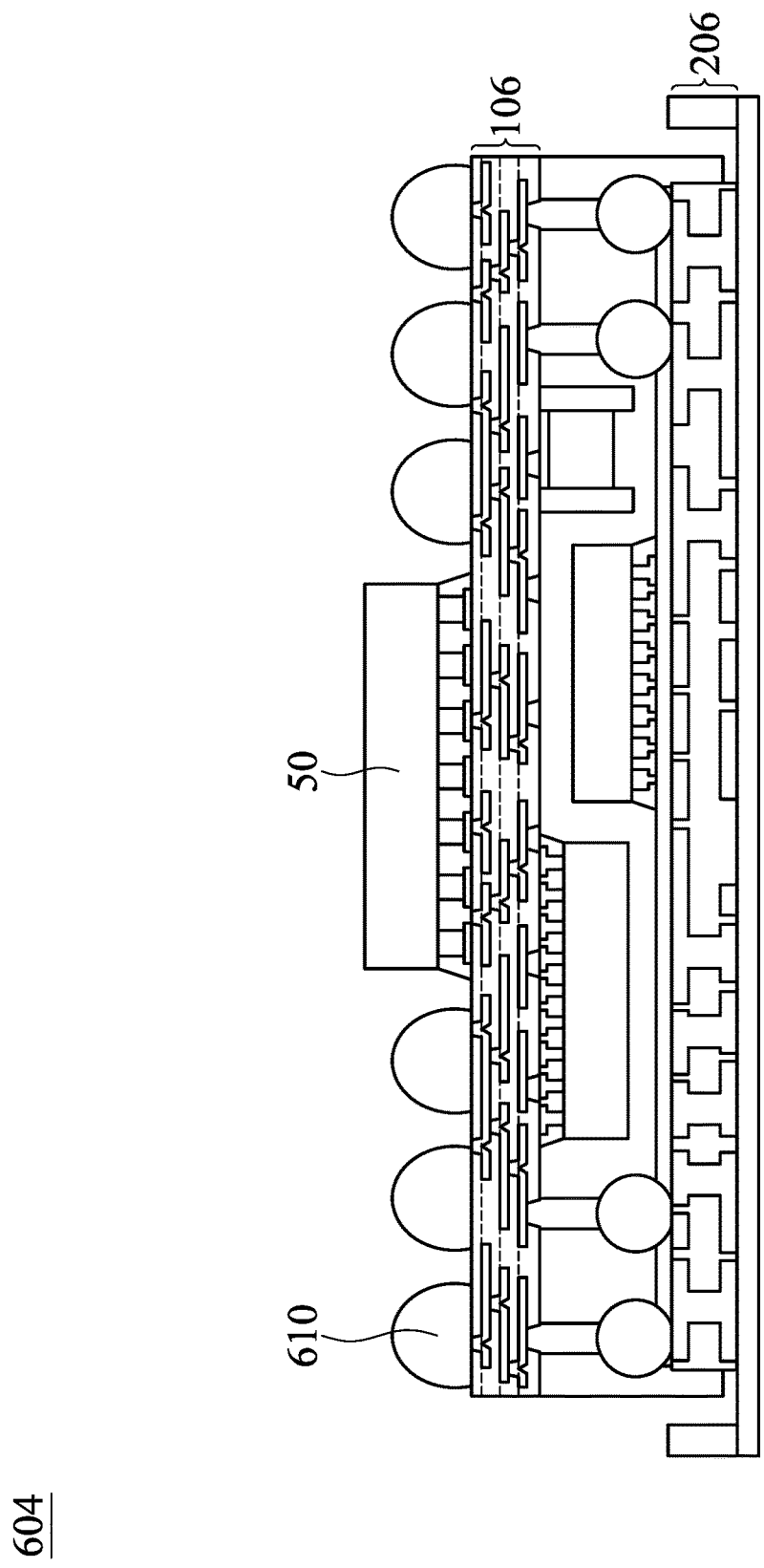
Figure 6H:
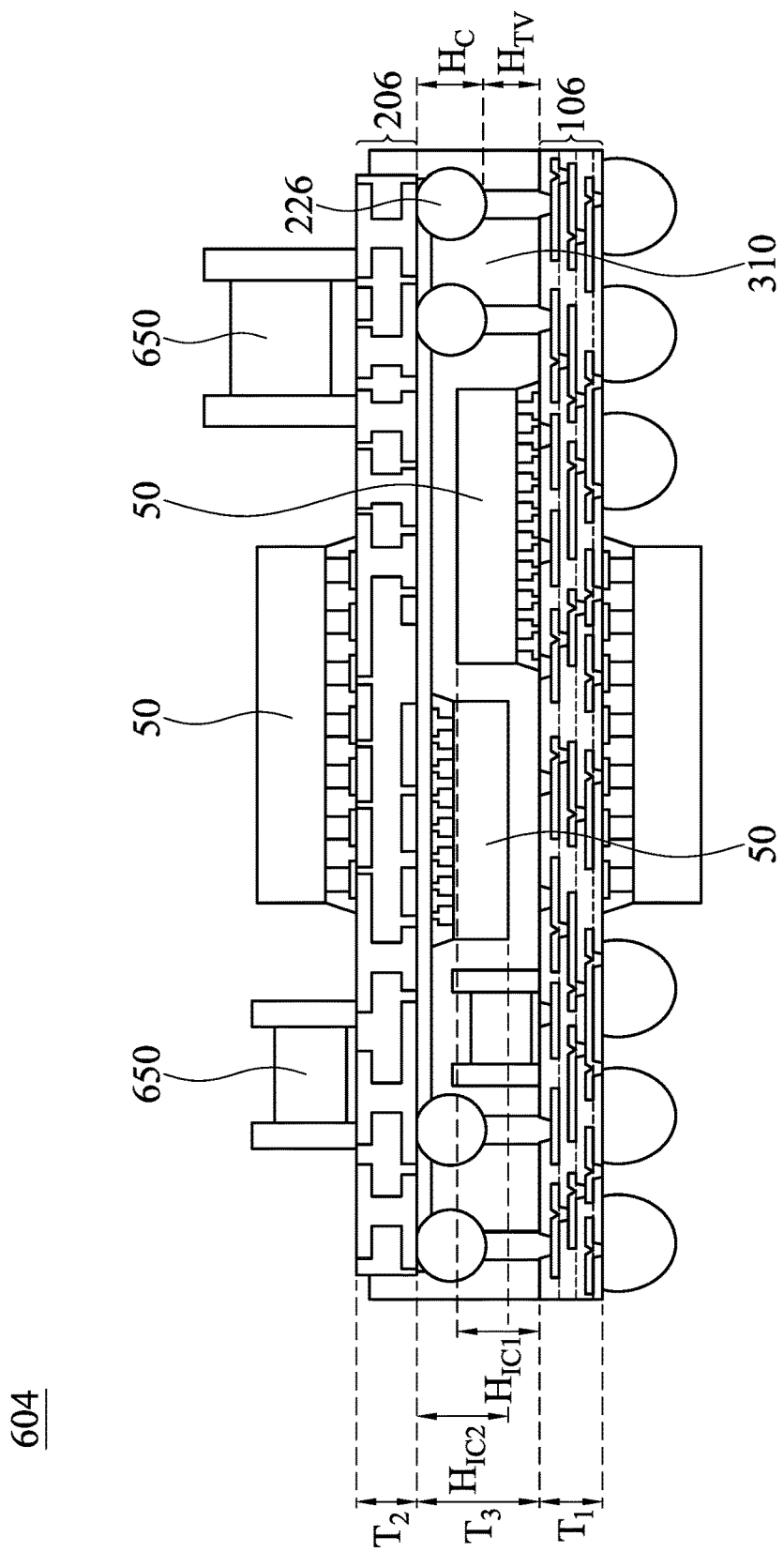

The package 604 may then be completed as shown in FIGS. 6F through 6H and in a similar manner as described above, such as in connection with FIGS. 4D through 4H and 5F through 5H. As shown in FIG. 6G, a third integrated circuit die 50 may be attached to the first-side redistribution structure 106 using processes and materials similar to those discussed above with reference to FIGS. 2G, 5B, and 5D, 6B, and 6D. In addition, external connectors 610 may be formed to provide means to subsequently attach other integrated circuit devices or packages. And as shown in FIG. 6H, a fourth integrated circuit die 50 and additional devices 650 may be attached to the second-side redistribution structure 206 using processes and materials similar to those discussed above with reference to FIGS. 2G, 4H, 5B, 5D, 5G, 5H, 6B, 6D, and 6G. A benefit of this layout includes allowing for a thinner package 604.

As discussed above, the first-side redistribution structure 106 and the second-side redistribution structure 206 are separated by the thickness $T_3$. In this embodiment, the thickness $T_3$ may be about 50 μm to about 500 μm. The ratio of thickness $T_3$ to thickness $T_1$ may be about 0.4 to about 25. The ratio of thickness $T_3$ to thickness $T_2$ may be about 0.03 to about 10. In addition, the connectors 226 may have a height $H_C$ that is about 10 μm to about 300 μm, or about 150 μm. As such, the total height of the through via 126 and the connector 226 in the package 604 may be about 100 μm to about 600 μm, or about 300 μm (noting that the total height may be less than the sum of the height $H_C$ and the height $H_{TV}$ due to reflowing the connector 226), which will be substantially the same as thickness $T_3$ of the region between the first-side redistribution structure 106 and the second-side redistribution structure 206. As further shown in FIG. 6H, the thickness $T_3$ is less than what the total height would be for stacking the first integrated circuit die 50 and the second integrated circuit die (height $H_{IC1}$ and height $H_{IC2}$, respectively). In other words, the lateral displacement of the first and second integrated circuit dies 50 with respect to one another allows for a lower thickness $T_3$. In some embodiments, the thickness of the encapsulant 310 between the first-side redistribution structure 106 and the backside surface of the second integrated circuit die 50 may be about 30 μm to about 300 μm, such as about 150 μm. In addition, the thickness of the encapsulant 310 between the second-side redistribution structure 206 and the first integrated circuit die 50 may be about 30 μm to about 300 μm, such as about 150 μm.

Embodiments may achieve advantages for system in package (SiP) structures for integrated circuits. For example, dual-sided routing (e.g., second-side and first-side redistribution structures) allows for each side of routing to be thinner and for a thinner overall semiconductor package while reducing overall package warpage. In addition, the carrier-type substrate used in one of the routing structures provides greater structural support, which also reduces overall package warpage. Further, the methodology described provides versatility in layout of the embedded integrated circuit dies and other devices. Indeed, vertically stacking the integrated circuit dies may provide sufficient space for additional devices to be attached to the first-side redistribution structure, whereas laterally displacing the integrated circuit dies may allow for an overall thinner package structure. It should also be appreciated that the first-side redistribution structure may be wider than the second-side redistribution structure, which permits the encapsulant to be formed around the second-side redistribution structure to strengthen the package and further reduce overall package warpage. Indeed, the methodology described provides for application of the encapsulant in such a way that there is no risk of mold creep along the outer surface of the second-side redistribution structure. This ensures that additional devices may be attached to the outer surface of the second-side redistribution structure without interference from trace amounts of encapsulant.

In an embodiment, a semiconductor package is fabricated by attaching a first component to a second component. The first component is assembled by forming a first redistribution structure over a substrate. A through via is then formed over the first redistribution structure, and a die is attached to the first redistribution structure active-side down. The second component includes a second redistribution structure, which is then attached to the through via. A molding compound is deposited between the first redistribution structure and the second redistribution structure and further around the sides of the second component.

In another embodiment, a semiconductor package is fabricated by forming a first component, forming a second package component, and attaching the second component to the first component. The first component is formed by forming a redistribution structure over a substrate, forming a through via over the redistribution structure, and attaching a die to the redistribution structure. The second component is formed by forming another redistribution structure over another substrate, forming a connector over this redistribution structure, and attaching another die to this redistribution structure. The second component is attached by flipping it over and bonding the connector to the through via by reflowing the connector. After attachment, the substrate is removed from the second component.

In yet another embodiment, a semiconductor package includes a first redistribution structure on a substrate and a second redistribution structure stacked on top of the first redistribution structure. The second redistribution structure includes a conductive via. The first redistribution structure is wider than the second redistribution structure. A through via electrically couples the first redistribution structure to the second redistribution structure. A die is attached to the first redistribution structure with the active side of the die facing and electrically coupled to the first redistribution structure. Another die is attached to the second redistribution structure with the active side of this die facing and electrically coupled to the second redistribution structure. An encapsulant fills in the region between the first redistribution structure and the second redistribution structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor package, the method comprising:
forming a first component, forming the first component comprising:
forming a first redistribution structure over a first substrate;
forming a through via over the first redistribution structure;
attaching a first die to the first redistribution structure, an active side of the first die facing and electrically coupled to the first redistribution structure;
after attaching the first die to the first redistribution structure, attaching a second component to the through via, the second component comprising a second redistribution structure attached to a second substrate; and
after attaching the second component, depositing a molding compound between the first redistribution structure and the second redistribution structure, a portion of the molding compound surrounding lateral edges of the second redistribution structure.

2. The method of claim 1 further comprising:
forming the second redistribution structure over the second substrate;
attaching a second die to the second redistribution structure, an active side of the second die facing and electrically coupled to the second redistribution structure; and
depositing a solder ball over the second redistribution structure.

3. The method of claim 2, wherein the attaching the second component comprises reflowing the solder ball to electrically couple the through via to the second redistribution structure.

4. The method of claim 2, wherein attaching the second component comprises attaching the second component such that the second die is directly above the first die, a backside of the first die facing a backside of the second die.

5. The method of claim 2, wherein attaching the second component comprises attaching the second component such that the second die is laterally displaced from the first die, a lateral side of the first die facing a lateral side of the second die.

6. The method of claim 2, wherein the forming the second redistribution structure comprises:
forming a first metal trace over the second substrate;
depositing Ajinomoto Build-up Film (ABF) over the first metal trace;
laser drilling an opening in the ABF;
forming a conductive via in the opening; and
forming a second metal trace over the conductive via.

7. The method of claim 1 further comprising:
removing the second substrate; and
after removing the second substrate, attaching passive devices to the second redistribution structure.

8. A method of forming a semiconductor package, the method comprising:
forming a first package component, the forming comprising:
forming a first redistribution structure over a first substrate;
forming a conductive pillar over the first redistribution structure; and
attaching a first die to the first redistribution structure;
forming a second package component, the forming comprising:
forming a second redistribution structure over a second substrate;
forming a connector over the second redistribution structure; and
attaching a second die to the second redistribution structure;
attaching the second package component to the first package component, the attaching comprising:
flipping the second package component over;
aligning the connector with the conductive pillar; and
reflowing the connector to bond the connector with the conductive pillar;
depositing an encapsulant around the first die and the second die; and
removing the second substrate.

9. The method of claim 8, wherein the depositing the encapsulant comprises depositing the encapsulant around a lateral edge of the second redistribution structure.

10. The method of claim 8, further comprising:
after removing the second substrate, forming a passivation layer over the second redistribution structure; and
attaching a third die to the second package component.

11. The method of claim 8, wherein the attaching the second package component to the first package component comprises aligning the second die to the first die such that a portion of the second die is directly over a portion of the first die.

12. The method of claim 8, wherein the attaching the second package component to the first package component comprises laterally displacing the second die with respect to the first die such that a lateral edge of the second die faces a lateral edge of the first die.

13. The method of claim 8, further comprising after removing the second substrate, attaching and electrically coupling a passive device to the second redistribution structure.

14. A method, comprising:
attaching a first die to a first redistribution structure, the first redistribution structure being disposed over a first substrate; and
forming a through via over the first redistribution structure;
providing a package component, the package component comprising:
a second redistribution structure disposed over a second substrate; and
a connector disposed over the second redistribution structure;
attaching the package component to the through via, the attaching comprising:
flipping the package component over the through via and the first die; and bonding the connector to the through via;
after attaching the package component to the through via, forming an encapsulant around sidewalls of the through via and the first die; and
removing the second substrate.

15. The method of claim 14, wherein the package component further comprises a second die.

16. The method of claim 15, wherein after bonding the connector to the through via, the second die is laterally displaced from the first die.

17. The method of claim 15, wherein after bonding the connector to the through via, the second die is directly above the first die.

18. The method of claim 15, wherein the forming the encapsulant comprises forming the encapsulant around sidewalls of the second die.

19. The method of claim 14 further comprising singulating the first substrate, wherein after singulating the first substrate, a sidewall of the second redistribution structure is in contact with the encapsulant.

20. The method of claim 19, wherein after singulating the first substrate:
the sidewall of the second redistribution structure is in contact with the encapsulant; and
sidewalls of the first redistribution structure are free of the encapsulant.

* * * * *